United States Patent
Habara et al.

(10) Patent No.: US 9,599,685 B2
(45) Date of Patent: Mar. 21, 2017

(54) ANTENNA DEVICE AND MAGNETIC RESONANCE IMAGING DEVICE FOR SUPPRESSING ABSORPTION RATE OF IRRADIATED WAVES

(75) Inventors: Hideta Habara, Musashino (JP); Yoshitaka Bito, Kokubunji (JP); Hisaaki Ochi, Kodaira (JP); Yoshihisa Soutome, Tokyo (JP); Masayoshi Dohata, Yokohama (JP); Tetsuhiko Takahashi, Tokyo (JP); Hiroyuki Takeuchi, Kashiwa (JP)

(73) Assignee: HITACHI, LTD., Tokyo (JP)

( * ) Notice: Subject to any disclaimer, the term of this patent is extended or adjusted under 35 U.S.C. 154(b) by 1018 days.

(21) Appl. No.: 13/877,702

(22) PCT Filed: Oct. 6, 2011

(86) PCT No.: PCT/JP2011/073119
§ 371 (c)(1),
(2), (4) Date: May 9, 2013

(87) PCT Pub. No.: WO2012/046812
PCT Pub. Date: Apr. 12, 2012

(65) Prior Publication Data
US 2013/0221968 A1 Aug. 29, 2013

(30) Foreign Application Priority Data
Oct. 7, 2010 (JP) ................. 2010-227515

(51) Int. Cl.
*G01R 33/34* (2006.01)
*G01R 33/345* (2006.01)
(Continued)

(52) U.S. Cl.
CPC . *G01R 33/34092* (2013.01); *G01R 33/34046* (2013.01); *G01R 33/3456* (2013.01);
(Continued)

(58) Field of Classification Search
CPC ............ G01R 33/34092; G01R 33/288; G01R 33/34046; G01R 33/3456; G01R 33/34056;
(Continued)

(56) References Cited

U.S. PATENT DOCUMENTS

| 4,751,464 A | 6/1988 | Bridges |
| 5,557,247 A | 9/1996 | Vaughn, Jr. |

(Continued)

FOREIGN PATENT DOCUMENTS

| JP | 2000-22431 | 1/2000 |
| JP | 2006-119146 | 5/2006 |

(Continued)

OTHER PUBLICATIONS

S. Orzada et al., A novel 7 T microstrip element using meanders to enhance decoupling, Proc. Intl. Soc. Mag. Reson. Med. 16, 2008, pp. 2979.

(Continued)

*Primary Examiner* — Dixomara Vargas
(74) *Attorney, Agent, or Firm* — Baker Botts L.L.P.

(57) ABSTRACT

There is provided a technique for suppressing increase of SAR without sacrificing sensitivity in RF coils used in MRI apparatuses. The present invention provides an antenna device comprising a sheet-shaped conductor and a ribbon-shaped conductor disposed on the subject side with respect to the sheet-shaped conductor with a predetermined distance from the sheet-shaped conductor. The ribbon-shaped conductor has a meandering shape, and is adjusted so as to resonate at transmission and reception frequencies, and it is constituted so that distance to the sheet-shaped conductor becomes smaller at both end part thereof along the static magnetic field direction compared with the distance to the sheet-shaped conductor at the center thereof. Moreover, the (Continued)

ribbon-shaped conductor is constituted so as to have a smaller width, as the distance to the sheet-shaped conductor becomes smaller.

15 Claims, 15 Drawing Sheets

(51) Int. Cl.
*H01Q 9/06* (2006.01)
*H01Q 21/20* (2006.01)
*G01R 33/28* (2006.01)
*G01R 33/36* (2006.01)
*G01R 33/422* (2006.01)

(52) U.S. Cl.
CPC ............ *H01Q 9/065* (2013.01); *H01Q 21/20* (2013.01); *G01R 33/288* (2013.01); *G01R 33/3657* (2013.01); *G01R 33/422* (2013.01)

(58) Field of Classification Search
CPC .. G01R 33/3657; G01R 33/422; H01Q 9/065; H01Q 21/20
See application file for complete search history.

(56) References Cited

U.S. PATENT DOCUMENTS

| | | | | |
|---|---|---|---|---|
| 6,100,694 | A * | 8/2000 | Wong | G01R 33/34046 324/318 |
| 6,326,787 | B1 * | 12/2001 | Cowgill | G01R 33/341 324/318 |
| 6,429,656 | B2 * | 8/2002 | Domalski | G01R 33/34046 324/318 |
| 6,498,487 | B1 * | 12/2002 | Haner | G01R 33/3628 324/309 |
| 6,674,285 | B2 * | 1/2004 | Haner | G01R 33/3628 324/309 |
| 7,095,230 | B2 * | 8/2006 | Blumich | G01R 33/3808 324/318 |
| 7,397,246 | B2 * | 7/2008 | Freytag | G01R 33/34069 324/318 |
| 7,688,070 | B2 | 3/2010 | Weyers et al. | |
| 8,143,896 | B2 * | 3/2012 | McDowell | G01N 24/088 324/318 |
| 8,810,338 | B2 * | 8/2014 | Fukunaga | H01P 1/20327 333/185 |
| 8,947,084 | B2 * | 2/2015 | Habara | G01R 33/34046 324/307 |
| 9,166,265 | B2 * | 10/2015 | Fukunaga | H01P 1/20327 |
| 9,182,463 | B2 * | 11/2015 | Habara | G01R 33/34046 |
| 2006/0006865 | A1 | 1/2006 | Zhang et al. | |

FOREIGN PATENT DOCUMENTS

| | | |
|---|---|---|
| JP | 2008-199204 | 8/2008 |
| WO | WO 2010/050279 A1 | 5/2010 |
| WO | WO 2011/105143 A1 | 9/2011 |

OTHER PUBLICATIONS

Cecil E. Hayes et al., An Efficient, Highly Homogeneous Radiofrequency Coil for Whole-Body NMR Imaging at 1.5 T, Journal of Magnetic Resonance 63, 1985, pp. 622-628.
Xiaoliang Zhang et al, Higher-Order Harmonic Transmission-Line RF Coil Design for MR Applications, Magnetic Resonance in Medicine 53, 2005, pp. 1234-1239.

* cited by examiner

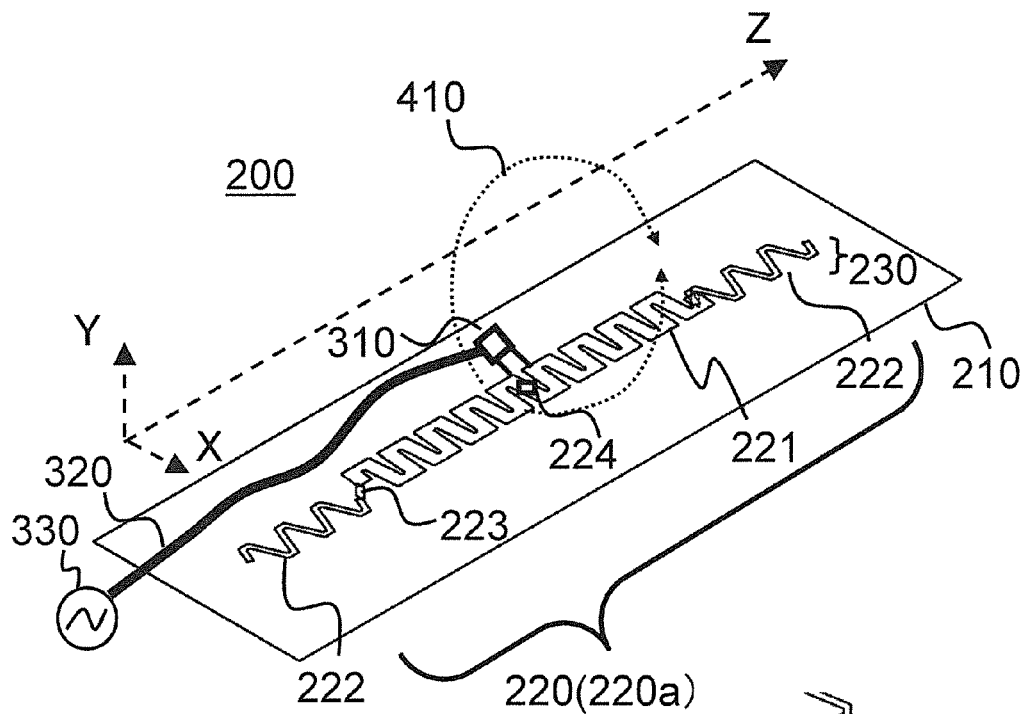
Fig. 2A
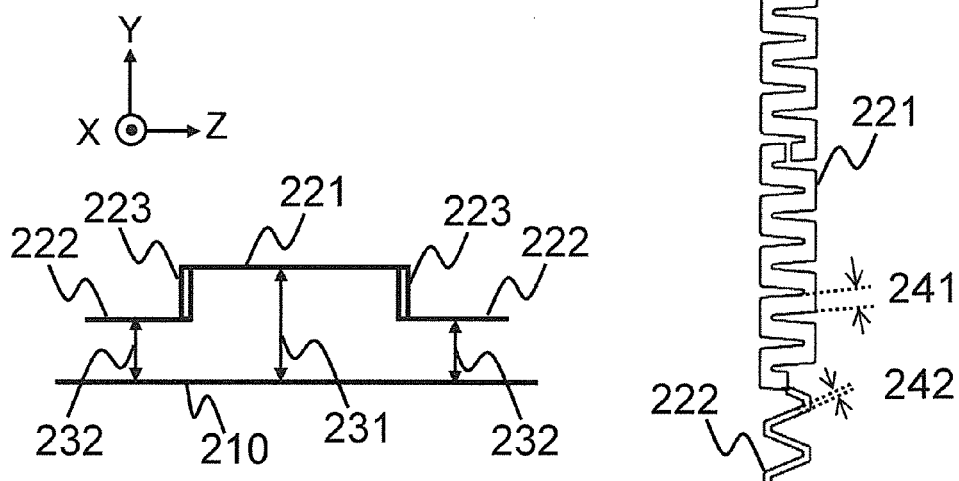
Fig. 2B
Fig. 2C

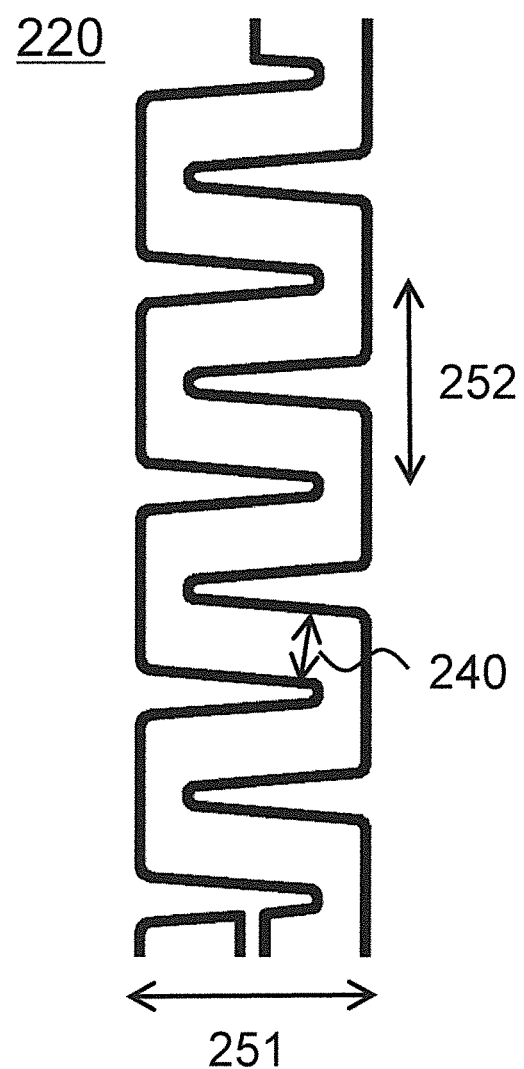

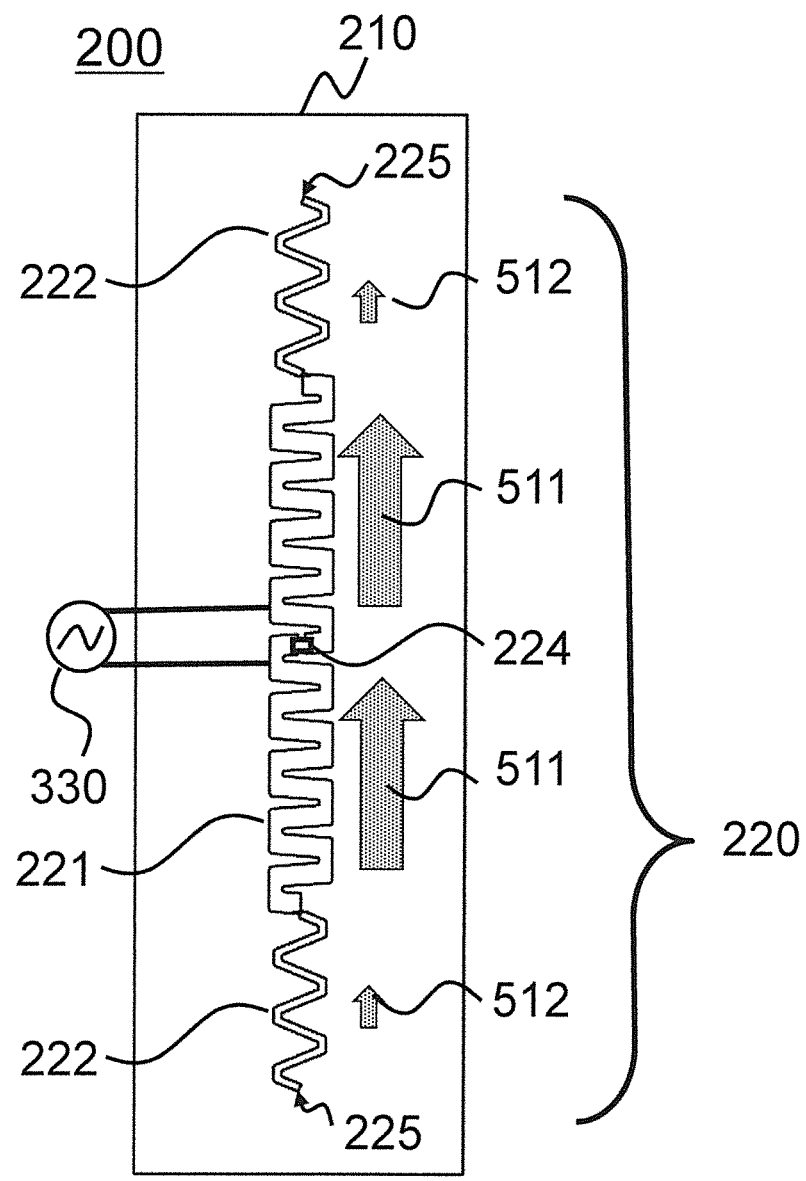

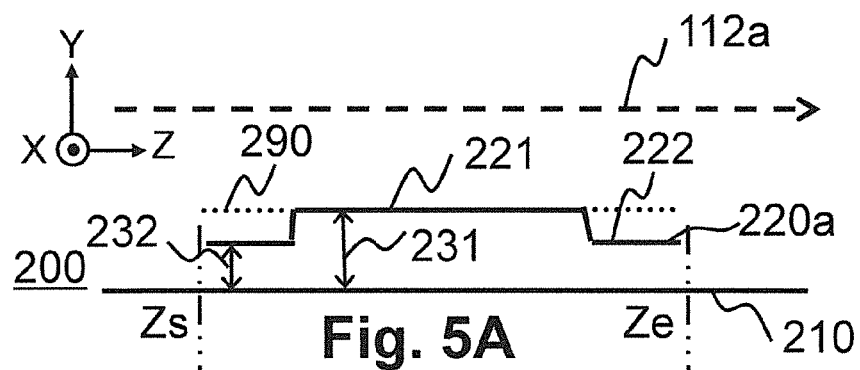
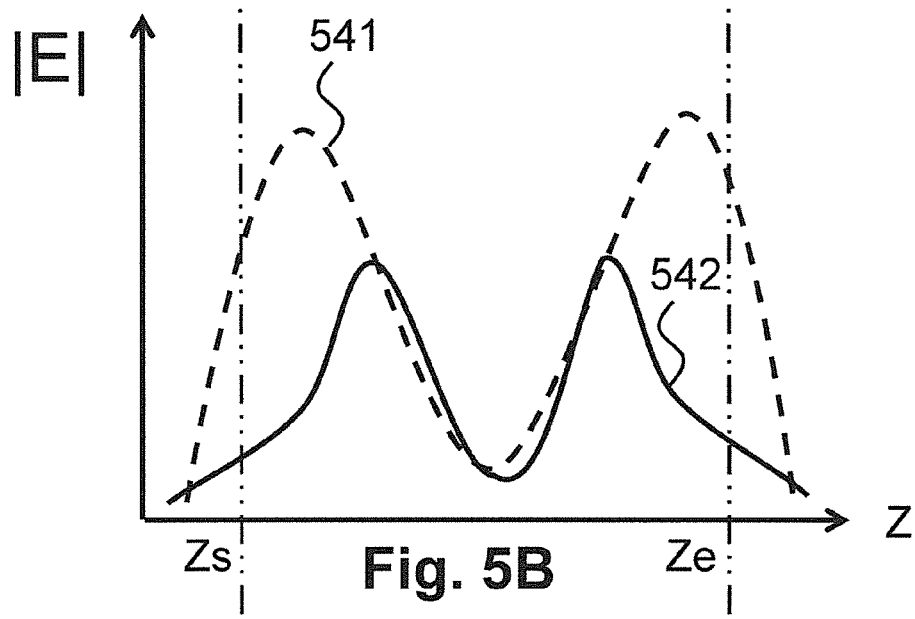
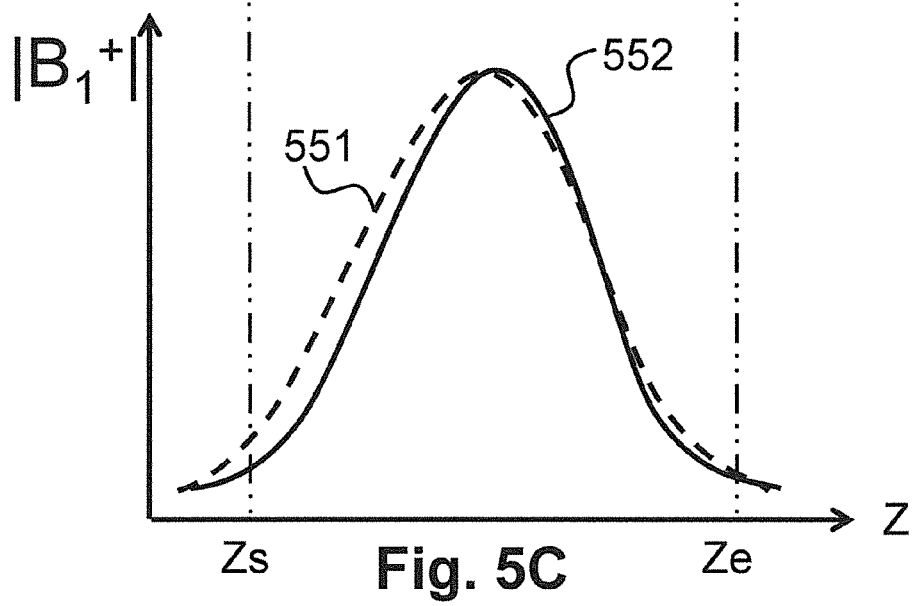

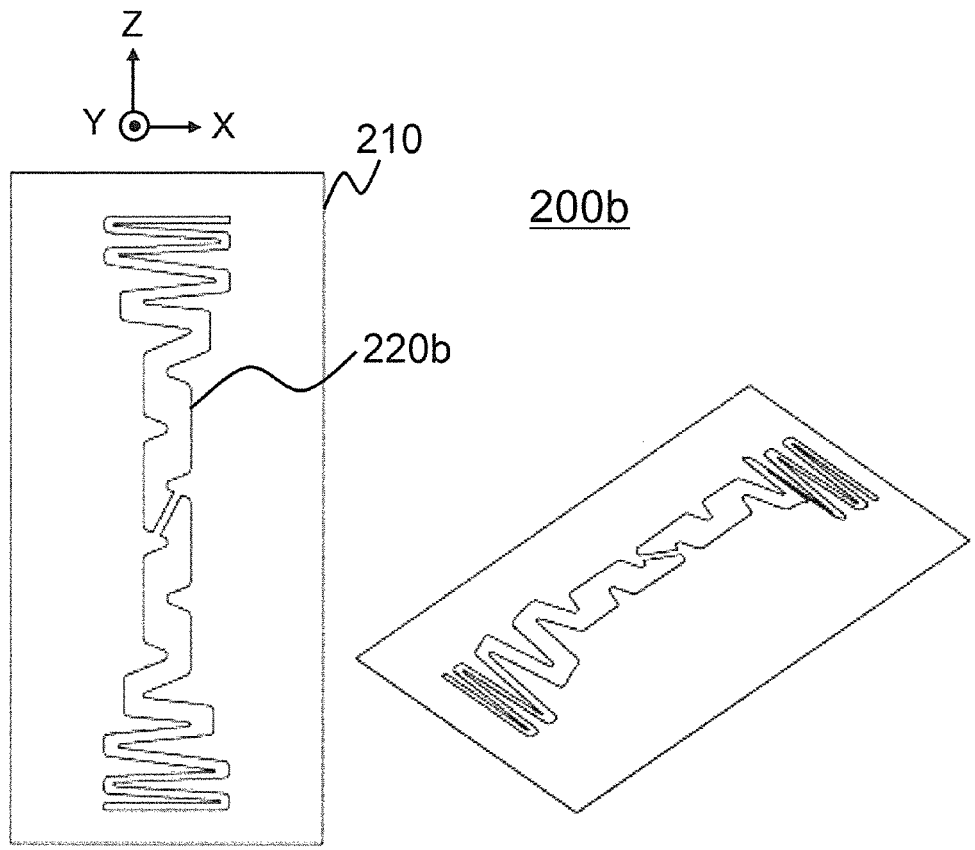
Fig. 7A     Fig. 7C
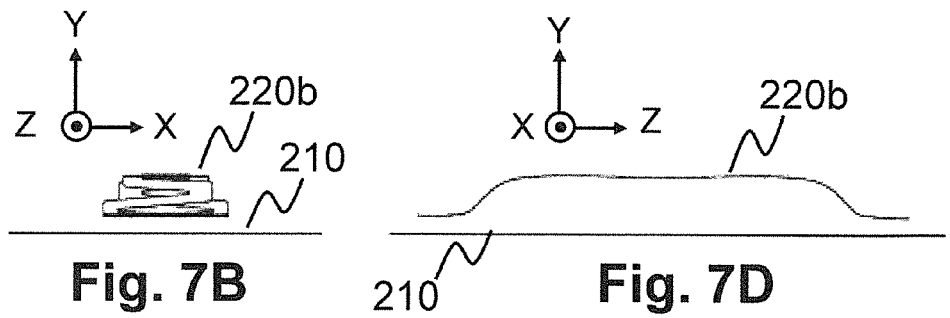
Fig. 7B     Fig. 7D

US 9,599,685 B2

ANTENNA DEVICE AND MAGNETIC RESONANCE IMAGING DEVICE FOR SUPPRESSING ABSORPTION RATE OF IRRADIATED WAVES

TECHNICAL FIELD

The present invention relates to an antenna device for transmitting and receiving electromagnetic waves, and a magnetic resonance examination apparatus (henceforth referred to as "MRI apparatus") using it.

CROSS-REFERENCE TO RELATED APPLICATION(S)

This application is a national stage application of PCT Application No. PCT/JP2011/073119 which was filed on Oct. 6, 2011, and published on Apr. 12, 2012 as International Publication No. WO 12/046812 (the "International Application"). This application claims priority from the International Application pursuant to 35 U.S.C. §365. The present application also claims priority under 35 U.S.C. §119 from Japanese Patent Application No. 2010-227515, filed on Oct. 7, 2010, the entire disclosure of which is incorporated herein by reference.

BACKGROUND ART

In MRI apparatuses, imaging of a subject is attained by irradiating the subject stayed in a uniform static magnetic field generated by a static magnetic field magnet with electromagnetic waves to induce excitation of nuclear spins in the subject, receiving electromagnetic waves generated by the nuclear spins, i.e., magnetic resonance signals, and processing the signals. The irradiation of the electromagnetic waves and reception of the magnetic resonance signals are performed by a device for transmitting and receiving electromagnetic waves of radio frequency (RF), which is called RF antenna or RF coil.

RF coils are roughly classified into two kinds of those called surface antennas or local antennas, and those called volume coils or volume antennas. The local antennas have a round shape or tabular shape, and show sensitivity in a region near the antennas, and they are used by being put on surface of a subject in many cases. On the other hand, the volume antennas have a cylindrical shape or a shape of two discs disposed upper and lower sides, and they show sensitivity in the whole volume in the cylinder or between the discs, and used by placing a subject in that space.

Examples of the volume antennas having a cylindrical shape include those of birdcage type (refer to, for example, Non-patent document 1 and Patent document 1), and those of TEM type (refer to, for example, Patent documents 2 and 3). In these volume antennas, about 16 to 32 conductors of a rod shape usually called rungs (crossbars or rungs of ladder) are disposed in parallel to the center axis of the cylinder and along the side of the cylinder. Such volume antennas in a cylindrical shape are used in an MRI apparatus of the tunnel type. In an MRI apparatus of the tunnel type, a static magnetic field magnet is disposed in a cylindrical shape to form a tunnel, a subject laid on a bed is entered into the inside of the tunnel, and imaging is performed.

Examples of the local antennas include, for example, one consisting of a conductor bent in the shape of a loop (refer to, for example, Patent document 4), one consisting of a conductor bent in the shape of figure eight (refer to, for example, Non-patent document 2), and so forth. Since such local antennas are usually disposed at positions nearer the subject compared with positions at which the volume antennas are disposed in many cases, they provides higher sensitivity compared with the volume antennas, but they can provide only a partial and narrower region for which sensitivity can be obtained in many cases. Therefore, the local antennas are used as a receiving RF antenna in many cases.

SUMMARY OF THE INVENTION

Object to be Achieved by the Invention

In recent years, high magnetic fields of three teslas or seven teslas are used in the tunnel type MRI apparatuses. In high magnetic field MRI apparatuses of three teslas or higher, SAR (Specific Absorption Rate), which is a ratio of absorption of irradiated RF electromagnetic waves into human bodies, tends to increase. This tendency becomes marked especially in transmission local antennas disposed near the subject.

The present invention was accomplished in view of the aforementioned circumstances, and an object of the present invention is to provide a technique for suppressing increase of SAR without sacrificing sensitivity in RF coils used in MRI apparatuses.

Means for Achieving the Object

The present invention provides an antenna device comprising a sheet-shaped conductor and a ribbon-shaped conductor disposed on the subject side with a predetermined distance from the sheet-shaped conductor. The ribbon-shaped conductor has a meandering shape, and is adjusted so as to resonate at transmission and reception frequencies, and it is constituted so that distance between the sheet-shaped conductor and the ribbon-shaped conductor at both end parts of the ribbon-shaped conductor for the static magnetic field direction is smaller than the distance at the center of the ribbon-shaped conductor. Moreover, the ribbon-shaped conductor is constituted so as to have a smaller width, as the distance between the sheet-shaped conductor and the ribbon-shaped conductor becomes smaller.

The present invention provides an antenna device used for at least one of transmission and reception of a radio frequency signal comprising a sheet-shaped conductor, M (M is an integer of 1 or larger) of ribbon-shaped conductor or conductors each comprising N (N is an integer of 1 or larger) of meander conductor or conductors disposed with a predetermined space from the sheet-shaped conductor and having a meandering shape, capacitor or capacitors disposed at one or more gaps provided in each meander conductor so as to connect portions of meander conductor divided by the gaps in series, and M of connection unit each connected to the capacitor or one of the capacitors in parallel in each ribbon-shaped conductor, wherein each meander conductor has a central conductor and end conductors disposed on both sides of the central conductor, space between each end conductor and the sheet-shaped conductor is smaller than space between the central conductor and the sheet-shaped conductor, and length, meandering width, length of one cycle of meandering of each ribbon-shaped conductor, and value of each capacitor are adjusted so that the antenna device resonates at frequency of the radio frequency signal.

In the aforementioned antenna device, when N representing the number of the meander conductor is 2 or larger, one end of each meander conductor is connected to one end of adjacent meander conductor so that the meander conductors constitute one string-shaped ribbon-shaped conductor as a whole.

The present invention also provides a magnetic resonance imaging apparatus comprising a static magnetic field generating unit which generates a static magnetic field, an RF coil which is disposed in the static magnetic field generated by the static magnetic field generating unit, and generates a radio frequency magnetic field in a direction perpendicular to the direction of the static magnetic field, or detects a radio frequency magnetic field in the direction perpendicular to the direction of the static magnetic field, and an imaging unit for imaging internal information of a subject stayed in the static magnetic field using nuclear magnetic resonance signals generated from the subject and detected by the RF coil, wherein the aforementioned antenna device is provided as the RF coil.

Effect of the Invention

According to the present invention, increase of SAR can be suppressed without sacrificing sensitivity in RF coils used in MRI apparatuses.

BRIEF DESCRIPTION OF THE DRAWINGS

FIG. 2A is an explanatory view for explaining the antenna according to the first embodiment, which is an exterior view of the antenna.

FIG. 2B is an explanatory view for explaining the antenna according to the first embodiment, which is a view of the antenna seen along the X-axis direction.

FIG. 2C is an explanatory view for explaining the antenna according to the first embodiment, which is a partial view of the ribbon-shaped conductor.

FIG. 3 is an explanatory view for explaining the ribbon-shaped conductor of the antenna according to the first embodiment.

FIG. 4 is an explanatory view for explaining current distribution in the antenna of the first embodiment.

FIG. 5A is an explanatory view for explaining electric field and rotating magnetic field formed by the antenna of the first embodiment, which is a view of the antenna seen along the X-axis direction.

FIG. 5B is an explanatory view for explaining electric field and rotating magnetic field formed by the antenna of the first embodiment, which is a graph of absolute value of electric field formed by the antenna near the subject.

FIG. 5C is an explanatory view for explaining electric field and rotating magnetic field formed by the antenna of the first embodiment, which is a graph of absolute value of rotating magnetic field formed by the antenna near the subject.

FIG. 7A is an explanatory view for explaining a modification of the antenna of the first embodiment, which is a view seen along the Y-axis direction.

FIG. 7B is an explanatory view for explaining a modification of the antenna of the first embodiment, which is a view seen along the Z-axis direction, FIG. 7C is an explanatory view for explaining a modification of the antenna of the first embodiment, which is a perspective view.

FIG. 7D is an explanatory view for explaining a modification of the antenna of the first embodiment, which is a view seen along the X-axis direction.

DETAILED DESCRIPTION

First Embodiment

Hereafter, the first embodiment of the present invention will be explained. In all the drawings for explaining the embodiments of the present invention, the same numerical symbols are used for elements having the same functions, and repetitive explanations of these are omitted.

Figure 1:
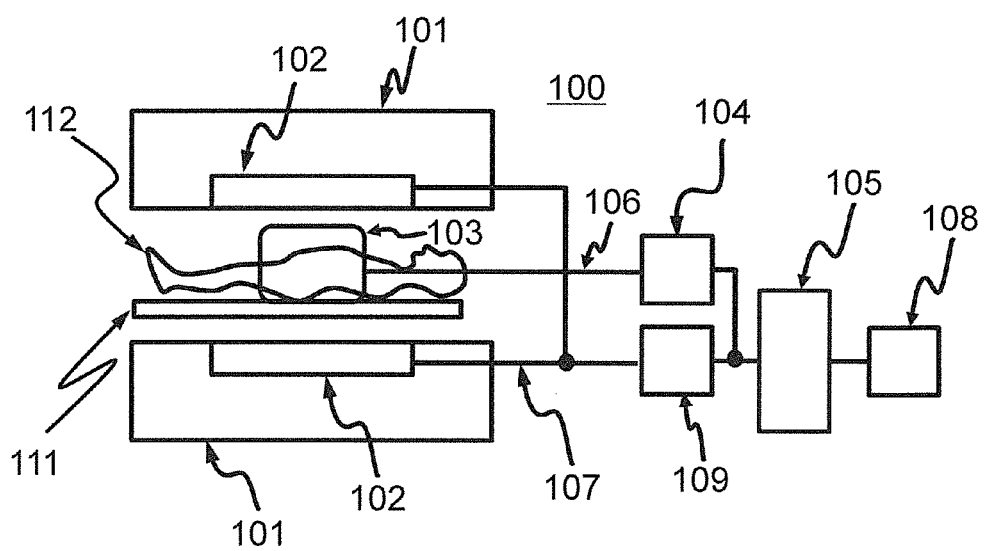
FIG. 1 is a schematic configurational diagram of an MRI apparatus according to the first embodiment.

First, configuration of the MRI apparatus according to this embodiment will be explained. FIG. 1 shows a schematic configurational diagram of an MRI apparatus 100 according to this embodiment. The MRI apparatus 100 is provided with a magnet 101 which forms a static magnetic field in a measurement space where a subject 112 is stayed, a gradient coil 102 which applies a magnetic field gradient of a predetermined direction to the static magnetic field, an RF coil 103 which is inserted into the magnet 101, transmits electromagnetic waves such as radio frequency waves to the subject 112, and receives electromagnetic waves, a transceiver 104 which is connected to the RF coil 103, creates electromagnetic waves to be irradiated from the RF coil 103, transmits them, detects nuclear magnetic resonance signals from the RE coil 103, and processes the signals, a gradient magnetic field power supply 109 which supplies electric current to the gradient coil 102, a data processing part 105 which controls drive of the transceiver 104 and the gradient magnetic field power supply 109, and performs various kinds of information processing, and through which the apparatus is operated by an operator, a display 108 for displaying results of processing performed by the data processing part 105, and a bed 111 on which the subject 112 is placed.

The gradient magnetic field power supply 109 and the gradient coil 102 are connected with a gradient magnetic field control cable 107. Further, the RF coil 103 and the transceiver 104 are connected with a transmission and reception cable 106 for transmitting and receiving signals between the RF coil 103 and the transceiver 104. The transceiver 104 is further provided with a synthesizer, power amplifier, receiving mixer, analogue to digital converter, transmit-receive changeover switch, and so forth, although they are not shown in the drawing.

The MRI apparatus 100 may be of a horizontal magnetic field type or a vertical magnetic field type according to the direction of the static magnetic field formed by the magnet 101. In the case of the horizontal magnetic field type, the magnet 101 generally has a cylindrical bore (center space), and generates a static magnetic field along the side-to-side direction in FIG. 1. On the other hand, in the case of the vertical magnetic field type, a pair of magnets are disposed on both the up and down sides of the subject, and generate a static magnetic field along the up-and-down direction in FIG. 1. The MRI apparatus 100 of this embodiment is of the horizontal magnetic field type, where the magnet has a bore of a cylindrical shape.

In the MRI apparatus 100 having the aforementioned configuration, electromagnetic waves and a gradient magnetic field are intermittently irradiated at intervals of around several milliseconds on the subject 112 stayed in the static magnetic field with the RF coil 103 and the gradient coil 102, respectively, signals emitted from the subject 112 by resonance with the electromagnetic waves are received, and signal processing is performed to obtain a magnetic resonance image. The subject 112 is, for example, a predetermined part of human body, laid on a bed 111, and placed in the inside of the RF coil 103. Further, the electromagnetic waves and the gradient magnetic field are irradiated and applied with the RF coil 103 and the gradient coil 102, respectively. The RF coil 103, the gradient coil 102, and the bed 111 are disposed in the cylindrical bore formed by the magnet 101.

In this drawing, although a single RF coil is shown as the RF coil 103 for irradiation and reception of electromagnetic waves, the present invention is not limited to such a configuration. For example, an RF coil consisting of a plurality of coils such as a combination of an RF coil for wide range imaging and an RF coil for parts may be used as the RF coil 103.

According to this embodiment, a local antenna having a substantially tabular shape is used as the RF coil 103. Hereafter, the RF coil 103 of this embodiment will be explained with reference to FIGS. 2 and 3.

FIG. 2A is an exterior view of an antenna 200 used as the RF coil 103 of this embodiment. Hereafter, in the drawings for this embodiment, X, Y, and Z represent axes of the orthogonal coordinate system for explaining the configuration of the antenna 200. As shown in this drawing, the antenna 200 of this embodiment is provided with a conductor 210 in the form of a sheet (henceforth referred to as sheet-shaped conductor), which serves as ground plane (grounding surface), and a meandering ribbon-shaped conductor 220. In this specification, the meandering direction means a direction along which the meandering conductor eventually extends. In the configuration of FIG. 2A, FIG. 2B and FIG. 2C, the direction of the Z-axis is defined as the meandering direction.

The ribbon-shaped conductor 220 is made of a conductor of an elongated tabular shape or a cylindrical shape. In the case of using a conductor of an elongated tabular shape, it is disposed so that tabular surface is substantially parallel to the surface of the sheet-shaped conductor 210. The ribbon-shaped conductor 220 is disposed with a predetermined distance (space) 230 from the sheet-shaped conductor on the side of the subject with respect to the sheet-shaped conductor 210.

The ribbon-shaped conductor 220 is constituted by a meander conductor 220a of which meandering direction is the Z-axis direction indicated in the drawing. The meander conductor 220a (ribbon-shaped conductor 220) has a shape having a width and extending along the Z-axis direction with meandering, as shown in FIG. 3. This width of the ribbon-shaped conductor 220 is referred to as conductor width 240, the width of meandering of the ribbon-shaped conductor 220 is referred to as meander width 251, and the length of one cycle of meandering of the ribbon-shaped conductor 220 along the Z-axis direction is referred to as pitch 252.

As shown in FIG. 2A, the meander conductor 220a is provided with a central conductor 221, which constitutes the central part, two end conductors 222 which constitute the both ends, connection conductors 223, which connect the central conductor 221 and two end conductors 222, and a capacitor 224. The meandering meander conductor 220a (ribbon-shaped conductor 220) is also called meander line, which means meandering pathway.

FIG. 2B is a view of the antenna 200 shown in FIG. 2A seen along the X-axis direction. As shown in this drawing, the connection conductors 223 connect the central conductor 221 and two end conductors 222 in a stair-like shape. In this shape, the central conductor 221 and the end conductors 222 are disposed so that distance (space) 231 between the central conductor 221 and the sheet-shaped conductor 210 is larger than distance (space) 232 between the end conductor 222 and the sheet-shaped conductor 210. This is for reducing electric field E that propagates from the end parts of the ribbon-shaped conductor 220 (meander conductor 220a) to the object of imaging, and thereby reducing SAR.

FIG. 2C is a view of the antenna 200 of FIG. 2A seen along the Y-axis direction, and is a partial view of the ribbon-shaped conductor 220. As shown in this drawing, the width 241 (or thickness of the meandering conductor) of the central conductor 221 is larger than the width 242 (or thickness of the meandering conductor) of the end conductor 222. This is for suppressing change of characteristic impedance of radio frequency transmission pathway as much as possible in spite of the difference of the distance (space) between the ribbon-shaped conductor 220 and the sheet-shaped conductor 210.

Further, the central conductor 221 has a gap at the center, at which the conductor is divided. The capacitor 224 connects the conductors on both sides of this gap in series. In addition, an impedance matching circuit 310 is connected to the capacitor 224 in parallel. The antenna 200 of this embodiment is connected to a transmission and/or reception part 330 via this impedance matching circuit 310 and a coaxial cable 320 connected to it. The coaxial cable 320 corresponds to the transmission and reception cable 106 shown in FIG. 1, and the transmission and/or reception part 330 corresponds to the transceiver 104 shown in FIG. 1.

Further, the total length of the meander conductor 220a and the value of the capacitor 224 are adjusted so that the antenna 200 resonates at a frequency used for transmission and/or reception, or a frequency used for MRI imaging. In addition, in this embodiment, they are adjusted so that node of electric current should not be generated in the current distribution of the meander conductor 220a in the resonating state, namely, the antenna 200 should serve as a half-wave antenna, which resonates at ½ wavelength (half wavelength).

For example, the frequency of RF used for a three-tesla MRI apparatus is about 128 MHz, and the length of the half wavelength in the air is about 1.2 m. When a linear half-wave antenna is produced, a conductor in a length of 1.2 m is usually used. In this embodiment, by forming the meander conductor 220a with the ribbon-shaped conductor 220 of a meandering shape, the length of Z-axis direction can be shortened to about 0.7 m. It is a size enabling satisfactory accommodation thereof in common MRI apparatuses for imaging of humans and satisfactory use thereof.

In addition, in this embodiment, the total length of the ribbon-shaped conductor 220 for the Z-axis direction is adjusted by adjusting the meandering width 251 and the pitch 252. Further, the length of the sheet-shaped conductor 210 for the Z-axis direction is determined to be the same as or longer than the length of the meander conductor 220a for the Z-axis direction.

When the antenna 200 resonates, and an electric current flows in the ribbon-shaped conductor 220, an alternating magnetic field (magnetic flux 410) is generated so as to surround the ribbon-shaped conductor 220. As shown in FIG. 2A, the magnetic flux 410 is perpendicular to the Z-axis direction. Therefore, by disposing the antenna 200 so that the direction of the static magnetic field in the MRI apparatus 100 is the Z-axis direction, MRI can be enabled. In addition, since there is the sheet-shaped conductor 210, the magnetic flux 410 efficiently spreads towards the subject 112. Therefore, the antenna 200 generates a magnetic field of intensity suitable for MRI.

FIG. 4 is a drawing for explaining current distribution in the antenna 200. In this drawing, intensities of the electric current flowing in the central conductor 221, and electric current flowing in the end conductors 222 are represented by size (width and length) of arrows 511 and 512. The electric currents are referred to as electric current 511 and electric current 512, respectively.

Since the both end parts 225 of the meander conductor 220a (ribbon-shaped conductor 220) are end parts of the conductor not connected to anywhere, electric current does not flow in them. In contrast, an electric current flows in the central part of the meander conductor 220a (ribbon-shaped conductor 220). In this case, the electric current 511 higher than the electric current 512 flowing in the end conductor 222 flows in the central conductor 221 constituting the central part. In the drawing, the arrows 511 are indicated as upward arrows for convenience, but since the electric current actually flowing in the antenna 200 is an alternate current, an upward flow and a downward flow are alternately repeated.

Hereafter, it will be explained that SAR is reduced by the configuration of the antenna 200 of this embodiment with maintaining the sensitivity as the RF coil 103 with reference to FIG. 5A, FIG. 5B, and FIG. 5C.

FIG. 5A is a view of the antenna 200 seen along the X-axis direction. In FIG. 5A, the sheet-shaped conductor 210 and the meander conductor 220a having the central conductor 221 and the end conductors 222 are schematically shown. The dotted lines 290 indicate a meander conductor (postulated meander conductor) seen along the X-axis direction in which the space 232 between the end conductors 222 and the sheet-shaped conductor 210 is supposedly the same as the space 231 between the central conductor 221 and the sheet-shaped conductors 210. It is henceforth called postulated meander conductor 290. Further, the broken line 112a parallel to the meander conductor 220a (ribbon-shaped conductor 220) and parallel to the Z-axis direction indicates a position (subject position) at which the subject 112 exists in usual MRI. Henceforth, it is referred to as subject position 112a.

FIG. 5B is a graph of absolute value |E| of the electric field at the subject position 112a calculated along the Z-axis. Further, Zs and Ze on the Z-axis represent the ends of the meander conductor 220a (ribbon-shaped conductor 220).

In the following paragraph, we consider about absolute value of the electric field E at the subject position 112a to be observed when an electric resonance current flows in the meander conductor 220a (ribbon-shaped conductor 220). In general, in the distribution of voltage V in the meander conductor 220a (ribbon-shaped conductor 220), voltage values at the both ends are positive or negative high values. Further, the voltages V of both ends have opposite signs, and if one of the two is at a high positive voltage V, the other is at a high negative voltage V. On the other hand, the voltage V of the central part of the meander conductor 220a (ribbon-shaped conductor 220) becomes extremely lower than those of the both ends, when the value is a comparatively large, i.e., 15 pF or larger, although it depends on the value of the capacitor 224 used.

Therefore, the absolute value |E| of the electric field E at the subject position 112a of the postulated meander conductor 290 disposed at a constant distance from the subject position 112a calculated along the Z-axis is indicated with the broken line 541 shown in FIG. 5B.

As described above, in this embodiment, the distance (space) 232 between the end conductor 222 and the sheet-shaped conductor 210 is determined to be smaller than the distance (space) 231 between the central conductor 221 and the sheet-shaped conductor 210. Therefore, at the parts of the end conductors 222, the distance between the meander conductor 220a (ribbon-shaped conductor 220) and the subject position 112a becomes larger than the distance between the postulated meander conductor 290 and the subject position 112a. Meanwhile, if the voltage V is constant, intensity of the electric field E is substantially in inverse proportion to the square of the distance. Therefore, absolute value |E| of the electric field E of the meander conductor 220a (ribbon-shaped conductor 220) at the subject position 112a calculated along the Z-axis is indicated with the solid line 542 shown in FIG. 5B.

Therefore, by making the end conductors 222 remoter from the subject position 112a, namely, making the distance (space) 232 between the end conductor 222 and the sheet-shaped conductor 210 narrower, in the meander conductor 220a (ribbon-shaped conductor 220), the absolute value |E| of the electric field at the subject 112a position can be decreased.

SAR is proportional to the square of the intensity of the electric field E. Therefore, if the heights of two right and left peaks become smaller in the graph of FIG. 5B, SAR decreases. Therefore, it can be understood that, according to the structure of the antenna 200 of this embodiment, in which the distance (space) 232 between the end conductor 222 and the sheet-shaped conductor 210 is made narrower than the distance (space) 231 between the central conductor 221 and the sheet-shaped conductor 210, SAR at the subject position 112a decreases.

Hereafter, there is considered intensity of the rotating magnetic field, which indicates sensitivity of the antenna 200 when the antenna 200 is used for MRI. FIG. 5C is a graph showing the absolute value of rotating magnetic field $B_1^+$ rotating around the Z-axis at the subject position 112a. The broken line indicates the absolute value 551 of the rotating magnetic field of the postulated meander conductor 290, and the solid line indicates the absolute value 552 of the rotating magnetic field of the meander conductor 220a (ribbon-shaped conductor 220) of this embodiment.

The rotating magnetic field $B_1^+$ is proportional to intensity of the electric current I which flows through the antenna conductor of the meandering shape. As described above, the electric current flowing through the antenna conductor of the meandering shape becomes high at the central part, and becomes low at the both end parts. This phenomenon is hardly influenced by change of the distance between the antenna conductor of the meandering shape and the sheet-shaped antenna conductor. Therefore, at the subject position 112a, the absolute value 551 of the rotating magnetic field formed by the postulated meander conductor 290 and the absolute value 552 of the rotating magnetic field formed by the meander conductor 220a (ribbon-shaped conductor 220) are substantially the same. That is, it can be understood that the sensitivities of them as an antenna are substantially the same.

Next, impedance matching of the central conductor 221 and the end conductor 222 will be explained.

In this embodiment, one ribbon-shaped conductor 220 constitutes a ½-wavelength antenna. Further, in this embodiment, in order to realize reduction of SAR, distance (space) 232 between the end conductor 222 and the sheet-shaped conductor 210 is made smaller than the distance (space) 231 between the central conductor 221 and the sheet-shaped conductor 210, as described above.

If the set of the meandering ribbon-shaped conductor 220 and the sheet-shaped conductor 210 is considered to be a radio frequency transmission pathway, when the distances (spaces) 230 from the central conductor 221 and the end conductor 222 to the sheet-shaped conductor 210 are different, but the conductor widths 241 of the central conductor 221 and the end conductor 222 are the same, characteristic impedances of the end conductor 222 and the central conductor 221 differ from each other. Specifically, the characteristic impedance of the central conductor 221 becomes higher than the characteristic impedance of the end conductor 222.

As described later, when the antenna resonates, and standing waves of ½ wavelength are generated in the antenna, if the distance (space) 230 to the sheet-shaped conductor 210 changes in a stair-like shape in the middle of the transmission line as in this embodiment, and characteristic impedances of the portions on the both sides of the changing point are not matched, wavelength shifts at that point. Therefore, in this embodiment, in order to match the characteristic impedances of the both, the conductor width 242 of the end conductor 222 is made thinner than the conductor width 241 of the central conductor 221.

Figure 6:
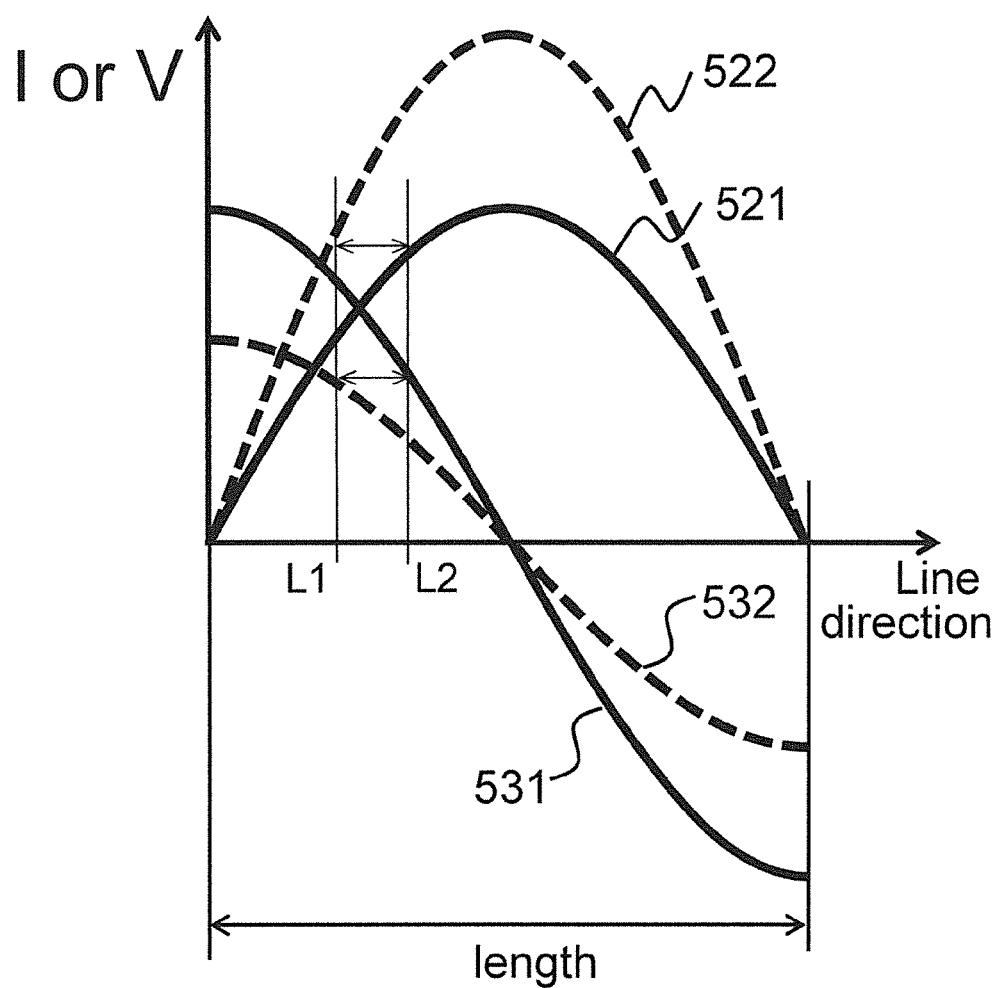
FIG. 6 is an explanatory view for explaining electric current and voltage to be generated in a conductor of a half-wave antenna.

Here, the reason why the wavelength shifts as described above will be explained. FIG. 6 is a graph showing electric current (I) flowing in two kinds of antenna conductors having different characteristic impedances (first antenna and second antenna) in a common half-wave antenna conductor, and voltage (V) at various positions. The horizontal axis represents position along the direction of the antenna conductor (line direction), and the vertical axis represents electric current (I) or voltage (V). It is supposed that the characteristic impedance of the first antenna is higher than the characteristic impedance of the second antenna. In addition, it is supposed that the lengths of the first antenna and the second antenna are the same, and they are indicated as length in the graph. The solid lines represent electric current 521 and voltage 531 of the first antenna, and the broken lines represent electric current 522 and voltage 532 of the second antenna.

As shown in this graph, both the electric current 521 flowing in the first antenna and the electric current 522 flowing in the second antenna becomes highest at the central part of the antenna conductor, and becomes smaller at the both ends. On the other hand, the absolute values of the voltages 531 and 532 become largest at the both ends, and the signs of the voltages at the both ends are opposite to each other. Further, the electric current 521 flowing in the first antenna having the relatively higher characteristic impedance is lower than the electric current 522 flowing in the second antenna conductor. On the other hand, the absolute value of the voltage 531 generated at the both ends of the first antenna conductor is larger than the absolute value of the voltage 532 generated at the both ends of the second antenna conductor.

The fundamental relation of voltage (V), electric current (I), and impedance (Z) is generally represented by the following equation (1).

$$V=IZ \qquad (1)$$

As seen from the equation (1), if the voltage (V) is constant, lower impedance (Z) provides higher electric current (I). Further, if the electric current (I) is constant, lower impedance (Z) provides lower voltage (V).

When transmission pathways of different characteristic impedances are connected, voltage and electric current must show continuity at the connection point. In FIG. 6, it is supposed that the first antenna conductor having a length of about ⅔ from the right and the second antenna conductor having a length of about ⅓ from the left are connected. In FIG. 6, the electric current value and voltage value at the position L1 of the first antenna conductor and those at the position L2 of the second antenna conductor are the same, respectively.

However, in FIG. 6, L1 and L2 are different positions. Therefore, in order to make L1 and L2 to be the same position for the connection, for example, tuning wavelength must be made longer. If the wavelength is made longer, the position of L1 shifts to the left, the position of L2 shifts to the right in FIG. 6, and they can be shifted so that they are at the same position. That is, in order to connect two of conductors without changing the lengths of the conductors and make them resonate at a half wavelength, they must be connected with reducing the tuning frequencies.

Further, contrary to the above, if it is supposed that the second antenna conductor having a length of about ⅔ from the right and the first antenna conductor having a length of about ⅓ from the left are connected, they must be connected with increasing the tuning frequencies.

Therefore, if it is intended to connect two of conductors having greatly different characteristic impedances, the frequencies must be reduced or increased in order to obtain the same electric currents and voltages at the connection point of the both, and thus there arises a problem that the frequencies deviate from the intended frequency.

In order to avoid the above problem, in the meander conductor 220a (ribbon-shaped conductor 220) of this embodiment, different conductor widths are used for the central conductor 221 and the end conductor 222 as described above to match the characteristic impedances.

The sheet-shaped conductor 210 used in this embodiment is formed with a conductor such as copper sheet, copper mesh, or stainless mesh. For example, when it is formed with a copper sheet, it is formed by sticking it on a sheet-shaped housing formed with fiber-reinforced plastics (FRP) or the like (not shown in the drawings).

The ribbon-shaped conductor 220 is formed with a conductor showing favorable electric conductivity such as copper sheet by forming a pattern using optical etching or the like. The ribbon-shaped conductor 220 is fixed on a base formed with an insulating substance such as plastics and glass fibers. This base is disposed above the sheet-shaped conductor 210. The base is formed by, for example, fixing several beams having a thickness of about 10 mm and made of a vinyl chloride resin, Teflon (registered trademark), or the like, and sticking an FR4 glass fiber substrate having a thickness of about 0.5 mm on them as a ceiling.

As explained above, the antenna 200 of this embodiment is provided with the sheet-shaped conductor 210, M (M is an integer of 1 or larger) of the ribbon-shaped conductor or conductors 220 each having N (N is an integer of 1 or larger) of the meander conductor or conductors of a meandering shape disposed with a predetermined space from the sheet-shaped conductor, the capacitor or capacitors 224 disposed at one or more gaps provided in each meander conductor so as to connect portions of meander conductor divided by the gaps in series, and the impedance matching circuit or circuits 310, which is/are M of the connection unit each connected to the capacitor or one of the capacitors 224 in parallel in each ribbon-shaped conductor 220, each meander conductor has the central conductor 221 and end conductors 222 disposed on both sides of the central conductor 221, the space 232 between each end conductor 222 and the sheet-shaped conductor 210 is smaller than the space between the central conductor 221 and the sheet-shaped conductor 210, when N is 2 or larger, one end of each meander conductor is connected to one end of adjacent meander conductor so that the meander conductors constitute one string-shaped ribbon-shaped conductor as a whole, and length, meandering width, length of one cycle of meandering of each ribbon-shaped conductor 220, and value of each capacitor 224 are adjusted so that the antenna device resonates at frequency of the radio frequency signal.

The length of the ribbon-shaped conductor 220, and the value of the capacitor 224 may be adjusted so that number of nodes of current distribution generated in the ribbon-shaped conductor 220 at the time of resonance is N−1, and the nodes are formed in the end conductor 222.

Further, the conductor width of the end conductor 222 connected to the central conductor 221 may be constituted narrower than the conductor width of the central conductor 221.

That is, according to the antenna 200 of this embodiment, the meander conductor 220a constituting the ribbon-shaped conductor 220 is provided with the central conductor 221 and the end conductors 222. In addition, the distance (space) 232 between each end conductor 222 and the sheet-shaped conductor 210 is shorter than the distance (space) 231 between the central conductor 221 and the sheet-shaped conductor 210. Therefore, high electric field parts locate in the end parts of the meander conductor 220a (ribbon-shaped conductor 220), and a high electric current and high generated magnetic field part locates in the central part of the meander conductor 220a (ribbon-shaped conductor 220). Therefore, there can be obtained the antenna 200 that can reduce SAR compared with an antenna constituted with a ribbon-shaped conductor disposed with a constant distance from the sheet-shaped conductor 210, but shows almost the same sensitivity.

As described above, in this embodiment, the ribbon-shaped conductor 220 has the smaller distance (space) 230 to the sheet-shaped conductor 210 at the part of end conductor 222 in order to reduce SAR. Therefore, if the gap is made narrower with the same conductor width, characteristic impedance is reduced. Therefore, in this embodiment, the conductor width of the part of the small distance (space) 230 is narrowed to maintain the characteristic impedance to be the same value for the whole ribbon-shaped conductor 220.

As described above, according to this embodiment, an RF antenna that can suppress SAR with maintaining the sensitivity can be realized. Therefore, by using this antenna for MRI, imaging can be performed under an SAR-suppressed condition. This embodiment is useful especially for MRI apparatuses using a magnetic field intensity of three teslas or higher, in which SAR significantly tends to increase.

Although an example where the central conductor 221 has only one gap is exemplified in FIG. 2A for the aforementioned embodiment, the number of the gap is not limited to this number. Two or more gaps may be provided in the central conductor 221, and the capacitor 224 may be disposed at each gap. Further, the gap may be provided in the part of the connection conductor 223, and the capacitor 224 may be disposed at that part.

Further, the meandering shape of the ribbon-shaped conductor 220 is also an important factor that determines the characteristic impedance of the radio frequency transmission pathway, like the distance (space) 230 between the ribbon-shaped conductor 220 and the sheet-shaped conductor 210.

As described above, in this embodiment, by adjusting the meandering width 251 and the pitch 252, the total length of the ribbon-shaped conductor 220 for the Z-axis direction is adjusted. In this case, for example, the total length may be shorten by making the pitch 252 of the end conductor 222 narrower than the pitch 252 of the central conductor 221. This is because the end conductor 222 has the smaller (thinner) conductor width 242 compared with the central conductor 221 as described above, and therefore it has a larger margin for making the pitch smaller. By shortening the total length of the ribbon-shaped conductor 220 for the Z-axis direction with such a configuration as mentioned above, the size of the whole antenna 200 for the Z-axis direction can be made smaller, and miniaturization of the antenna 200 can be attained.

When the set of the meandering ribbon-shaped conductor 220 and the sheet-shaped conductor 210 having a certain length for the Z-axis direction is considered to be a radio frequency transmission pathway, a number representing how many times of the wavelength corresponds to the length for a predetermined frequency is referred to as electrical length. As described above, the electrical length for a linear conductor having a length of 1.2 m placed in air or vacuum at 128 MHz is half wavelength. The ribbon-shaped conductor 220 made to have a meandering shape has a length for the Z-axis direction of about 0.7 m, but the electrical length thereof at 128 MHz is also half wavelength. Further, a value obtained by dividing the actual length (0.7 m) of the conductor giving an electrical length (1.2 m) of half wavelength with the length of the half wavelength of the electric wave in vacuum is also called wavelength-shortening ratio (%), and value of the wavelength-shortening ratio is the same as the ratio of velocity of propagation to that of in vacuum. As described above, the electrical length is a quantity directly relating to the wavelength-shortening ratio.

The electrical length strongly correlates with the distance (space) 230 between the ribbon-shaped conductor 220 and the sheet-shaped conductor 210, the meandering width 251, and the pitch 252. More specifically, if the space 230 is made larger, the meandering width 251 is narrowed, or the pitch 252 is made larger, the electrical length of the ribbon-shaped conductor for the same length for the Z-axis direction becomes shorter. Further, the wavelength-shortening ratio becomes larger and approaches 1.

On the contrary, if the space 230 is made smaller, the meandering width 251 is made larger, or the pitch 252 is made smaller, the electrical length of the ribbon-shaped conductor for the same length for the Z-axis direction becomes longer. Further, the wavelength-shortening ratio becomes smaller and approaches 0.

Further, as described above, the characteristic impedance of the radio frequency propagation pathway strongly correlates with the distance (space) 230 between the sheet-shaped conductor 210 and the ribbon-shaped conductors 220, and with the conductor width 241. More specifically, if the space 230 is made wider, or the conductor width 241 is narrowed, the characteristic impedance becomes larger. On the contrary, if the space 230 is narrowed, or the conductor width 241 is made wider, the characteristic impedance becomes smaller.

The characteristic impedance and the electrical length can be adjusted by using such characteristics as described above. By adjusting the electrical length, length for the Z-axis direction of an actual antenna can be adjusted.

In the above explanation of this embodiment, the conductor of a meandering shape having two different widths (diameters), the central conductor 221 and the end conductor 222, are connected to constitute the meander conductor 220a (ribbon-shaped conductor 220). This meander conductor is constituted so that each conductor maintains a constant distance (space) with respect to the sheet-shaped conductor 210, namely, they form a stair-like shape. However, the configuration of the antenna 200 of this embodiment is not limited to this configuration.

The distance (space) between the sheet-shaped conductor 210 and the ribbon-shaped conductor 220 may not change in a stair-like shape. Another configuration according to this embodiment is shown in FIG. 7A, FIG. 7B, FIG. 7C, and FIG. 7D. FIG. 7A shows a view of a modification of the antenna of this embodiment (antenna 200b) seen along the Y-axis direction, FIG. 7B is a view of the antenna seen along the Z-axis direction, FIG. 7C is a perspective view, and FIG. 7D is a view of the antenna seen along the X-axis direction. The capacitor 224, and the impedance matching circuit 310, which is a means for connection to the transmission and/or reception part 330, are the same as those of the case shown in FIG. 2A, FIG. 2B and FIG. 2C, and therefore they are omitted and are not shown in the drawings.

As shown in these drawings, the distance between the meander conductor 220b (ribbon-shaped conductor 220) and the sheet-shaped conductor 210 may be constituted so as to change continuously. That is, the distance (space) between the meander conductor 220b and the sheet-shaped conductor 210 may be changed so that it continuously and smoothly becomes smaller toward the end part. In this case, the width (diameter) of the meander conductor 220b (ribbon-shaped conductor 220), the meandering width and pitch thereof are also continuously changed according to the distance to the sheet-shaped conductor 210. On the other hand, for a part having a constant distance to the sheet-shaped conductor 210 such as the central part of the meander conductor 220b, constant width, meandering width, and pitch are used.

In addition, the distance between the meander conductor 220b (ribbon-shaped conductor 220) and the sheet-shaped conductor 210 is changed so that it becomes large at the central part and becomes small at the both end parts as shown in FIG. 7D. This is for narrowing the distances from the sheet-shaped conductor 210 to the both end parts of the meander conductor 220b, so that an electric field E formed by voltage V generated by the both end parts does not propagate to the neighborhood of the subject 112, and thereby suppressing SAR, as described above. In addition, in order to match the characteristic impedances, the conductor width of the meander conductor 220b is made smaller towards the end part.

Further, in the above explanation of this embodiment, the ribbon-shaped conductor 220 is disposed so that the end conductor 222 thereof is closer to the sheet-shaped conductor 210 compared with the central conductor 221 in order to reduce SAR. However, the method for reducing SAR is not limited to the above. For example, there may be employed a configuration that a substance showing a high dielectric constant is further disposed in a space between the end conductor 222 and the sheet-shaped conductor 210.

By disposing a substance showing a high dielectric constant, both the electrical length as the radio frequency transmission pathway and characteristic impedance described above can be changed at a rate of about square root of specific dielectric constant of the dielectric substance. More specifically, it has been found that if a substance showing a dielectric constant of about 2 such as Teflon (registered trademark) is disposed in the space 230, the characteristic impedance is reduce to about 0.7 time, and the electrical length is made longer to about 1.3 times of the wavelength.

By disposing a substance showing a high dielectric constant between the end conductor 222 and the sheet-shaped conductor 210, the electric field can be more effectively concentrated between the sheet-shaped conductor 210 and the end conductor 222, and SAR can be further reduced.

When a substance showing a high dielectric constant is disposed between the end conductor 222 and the sheet-shaped conductor 210, the distance (space) 232 between the end conductor 222 and the sheet-shaped conductor 210 may be made to be substantially the same as the distance (space) 231 between the central conductor 221 and the sheet-shaped conductor 210. Also in this case, in order to match the characteristic impedances, the width 242 of the end conductor 222 is made thinner than the width 241 of the central conductor 221.

Furthermore, a shield may be provided so as to wrap and cover the end conductor 222. An exterior view of an antenna 200c of this case is shown in FIG. 8.

As shown in this drawing, the antenna 200c is provided with the sheet-shaped conductor 210, the ribbon-shaped conductor 220, and shields 260. The ribbon-shaped conductor 220 is provided with the central conductor 221 and two end conductors 222, like the aforementioned configuration.

Figure 8:
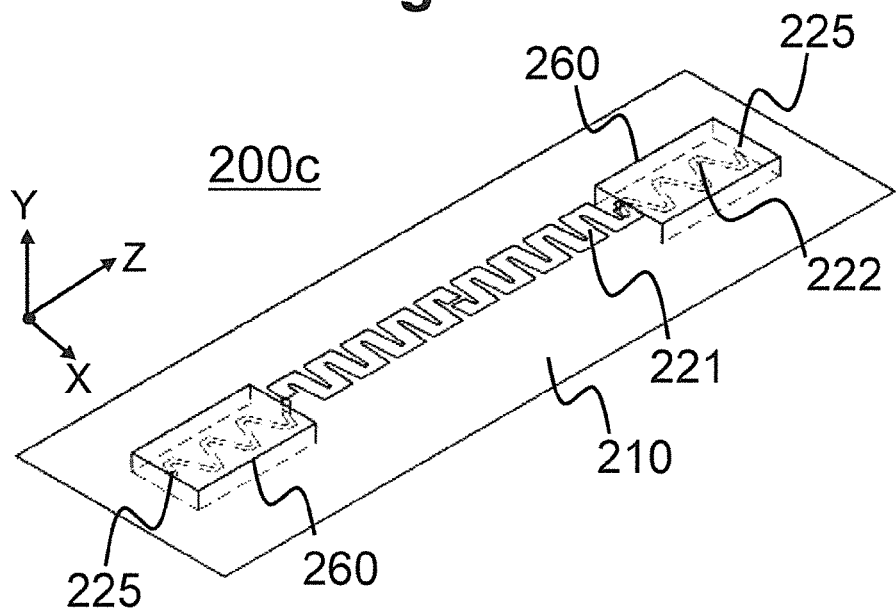
FIG. 8 is an exterior view of the modification of the antenna of the first embodiment.

The shields 260 are disposed so as to wrap and cover the both end conductors 222 as described above, and are each constituted with, for example, a box-like conductor consisting of four in total of rectangular surfaces as shown in FIG. 8. The four rectangular surfaces consist of one surface perpendicular to the Y-axis direction, two surfaces perpendicular to the X-axis direction, and one surface perpendicular to the Z-axis direction, and cover the upper side, left side, right side, and the side of the end part 225 of the end conductor 222, respectively. In addition, the shields 260 are disposed so that they do not contact with the both ends of the ribbon-shaped conductor 220, and they are electrically and structurally connected to the sheet-shaped conductor 210.

By employing such a configuration as described above, the rate of leak of the electric field generated at the end conductor 222 out of the shield 260 is reduced, suppression of SAR is provided as a result, and the antenna shall have favorable functions as an antenna used for MRI.

Second Embodiment

The second embodiment of the present invention will be explained below. In this embodiment, an antenna is constituted by using a ribbon-shaped conductor consisting of a combination of a plurality of the meander conductors of the first embodiment, so that sensitivity area of the RF coil 103 is extended. The MRI apparatus of this embodiment basically has the same configuration as that of the MRI apparatus 100 of the first embodiment. Hereafter, this embodiment will be explained with emphasizing the configuration different from that of the first embodiment.

Figure 9:
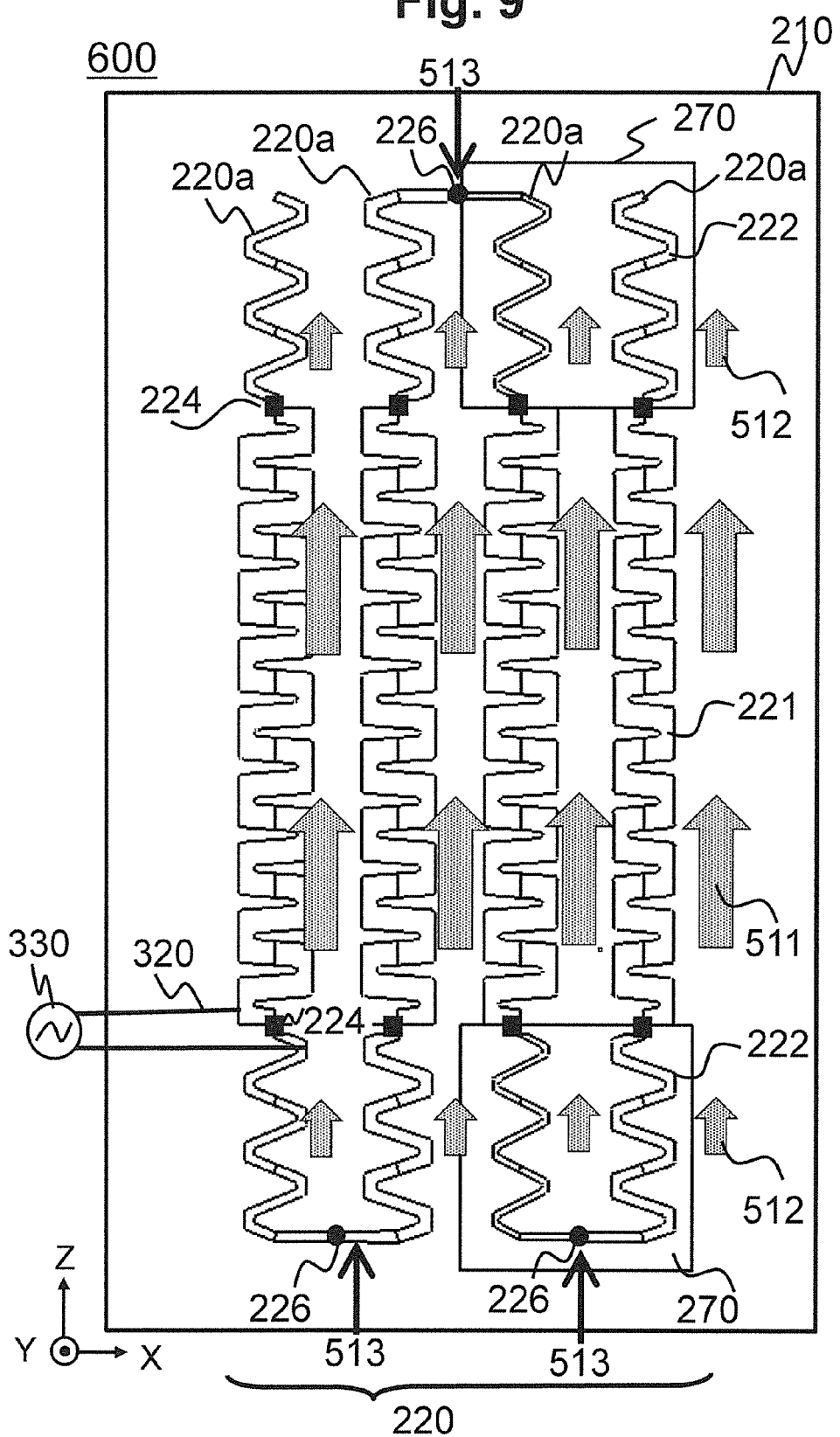
FIG. 9 is an explanatory view for explaining the antenna of the second embodiment.

FIG. 9 shows an exterior view of an antenna 600 used as the RF coil 103 of this embodiment. In the drawing, X, Y, and Z represent axes of the orthogonal coordinate system for explaining the configuration of the antenna 600.

As shown in this drawing, the antenna 600 of this embodiment is provided with the ribbon-shaped conductor 220 and the sheet-shaped conductor 210, as in the first embodiment. Further, the ribbon-shaped conductor 220 of this embodiment is provided with a plurality of meander conductors 220a of the first embodiment of which meandering direction is the Z-axis direction. In this drawing, the ribbon-shaped conductor 220 having four meander conductors 220a is shown as an example. That is, if the number of the meander conductors 220a constituting the antenna 600 is represented with N, the antenna wherein N is 4 is exemplified. The configuration of each meander conductor 220a is basically the same as that of the first embodiment. Further, the first embodiment corresponds to this embodiment where N is 1.

The meander conductors 220a are disposed in parallel along the Z-axis direction at substantially the same position for the Z-axis direction with substantially the same intervals for the X-axis direction. Further, one of the end conductors 222 of each meander conductor 220a is connected to one of the end conductors 222 of the adjacently disposed meander conductor 220a on the same side, so that the meander conductors 220a constitute the ribbon-shaped conductor 220 in the form of one string as a whole. The connection point between the meander conductors 220a, i.e., between the end conductors 222, is called the connection point 226.

In addition, also in this embodiment, the distance (space) 231 between the central conductor 221 and the sheet-shaped conductor 210 is larger than the distance (space) 232 between each end conductor 222 and the sheet-shaped conductor 210 in each meander conductor 220a.

Further, in this embodiment, a board consisting of a substance 270 having a high dielectric constant is disposed between each end conductor 222 of the meander conductor 220a and the sheet-shaped conductor 210 for the two meander conductors 220a on the right side in FIG. 9. With such a configuration, the electric field can be more effectively concentrated between the sheet-shaped conductor 210 and the end conductor 222 of the meander conductor 220a to reduce SAR.

The board consisting of the substance 270 having a high dielectric constant may not necessarily be disposed. Further, when it is disposed, the position is not limited to such a position as mentioned above, i.e., a position overlapping with two of the meander conductors 220a.

In the antenna 600 of this embodiment, the ribbon-shaped conductor 220 is fixed on a base formed with an insulating substance, and disposed above the sheet-shaped conductor 210, as in the first embodiment.

Further, the antenna 600 of this embodiment is connected to the transmission and/or reception part 330 via the coaxial cable 320 connected in parallel with one capacitor 224. In addition, the capacitor 224 to which the coaxial cable 320 is connected in parallel may be any of the capacitors. Further, although an example wherein the capacitor 224 is disposed at the connection conductor 223 connecting the end conductor 222 and the central conductor 221 is mentioned in the above explanation of this embodiment, the disposition position of the capacitor 224 is not limited to such a position. It may be disposed at any position on the ribbon-shaped conductor 220 except for the connection point 226.

Further, also in the antenna 600 of this embodiment, the total length of the ribbon-shaped conductor 220 and the value of the capacitor 224 are adjusted so that it resonates at the frequency of the signals to be used.

In the antenna 600 of this embodiment, intensities of the electric currents 511 and 512 flowing through the ribbon-shaped conductors 220 when the antenna resonates are represented with the arrows 511 and 512. As in the first embodiment, the electric current becomes higher at the central conductor 221 of each meander conductor 220a, and becomes small in the end conductor 222. The number of the nodes 513 in the current distribution corresponds to a number obtained by subtracting 1 from N, the number of the meander conductor 220a. That is, in the example shown in FIG. 9, it is 3 (N−1=4−1=3). Further, the nodes 513 locate in a region where the space between the sheet-shaped conductor 210 and the ribbon-shaped conductor 220 is narrow, i.e., on the end conductor 222, and they are generated around the connection point 226 of each meander conductor 220a or the neighborhood thereof.

Since the direction of the electric current is reversed at the node 513 of the current distribution, all the directions of the electric currents 511 and 512 are the same in FIG. 9 where the ribbon-shaped conductor 220 having four meander conductors 220a is seen along the Y-axis direction. Therefore, the directions of the magnetic fields generated by the electric currents 511 and 512 are also the same. Accordingly, the antenna 600 of this embodiment has antenna sensitivity for a large region for the side-to-side direction (X-axis direction) in FIG. 9.

As explained above, the antenna 600 of this embodiment is provided with the sheet-shaped conductor 210, M (M is an integer of 1 or larger) of the ribbon-shaped conductor or conductors 220 each having N (N is an integer of 1 or larger) of the meander conductor or conductors of a meandering shape disposed with a predetermined space from the sheet-shaped conductor, the capacitor or capacitors 224 disposed at one or more gaps provided in each meander conductor so as to connect portions of meander conductor divided by the gaps in series, and M of the connection unit each connected to the capacitor or one of the capacitors 224 in parallel in each ribbon-shaped conductor 220, each meander conductor has the central conductor 221 and end conductors 222 disposed on both sides of the central conductor 221, the space 232 between each end conductor 222 and the sheet-shaped conductor 210 is smaller than the space 231 between the central conductor and the sheet-shaped conductor, when N is 2 or larger, one end of each meander conductor is connected to one end of adjacent meander conductor so that the meander conductors constitute one string-shaped ribbon-shaped conductor as a whole, and length, meandering width, length of one cycle of meandering of each ribbon-shaped conductor 220, and value of each capacitor 224 are adjusted so that the antenna resonates at frequency of the radio frequency signal.

The length of the ribbon-shaped conductor 220, and the value of the capacitor 224 may be adjusted so that number of nodes of current distribution generated in the ribbon-shaped conductor 220 at the time of resonance is N−1, and the nodes are formed in the end conductor 222.

Further, the conductor width of the end conductor 222 connected to the central conductor 221 may be constituted to be narrower than the conductor width of the central conductor 221.

Furthermore, the connection capacitor 224 may be provided to connect the central conductor 221 and the end conductor 222 in series, and the connection unit may be connected to the connection capacitor in parallel.

Thus, because of such a configuration as mentioned above, in the antenna 600 of this embodiment, high electric field parts locate in the regions of the end parts of the meander conductor 220a constituting the ribbon-shaped conductor 220, and a high electric current and high generated magnetic field part locates in the central part of the meander conductor 220a. Therefore, there can be obtained the antenna 600 that can reduce SAR compared with an antenna constituted with a ribbon-shaped conductor disposed with a constant distance from the sheet-shaped conductor 210, but shows almost the same sensitivity.

Therefore, according to this embodiment, an RF antenna that can suppress SAR with maintaining the sensitivity can be realized. Further, an antenna that shows sensitivity for a still larger region compared with the antenna of the first embodiment can be realized. Therefore, by using this antenna for MRI, imaging can be realized in a state that SAR is suppressed. This embodiment is also useful especially for MRI apparatuses using a magnetic field intensity of three teslas or higher, like the first embodiment.

In addition, the end conductor 222 of each meander conductor 220a may be constituted so as to have a conductor width 242 varying according to the distance from the sheet-shaped conductor 210.

Further, like the first embodiment, by making the pitch 252 of the end conductor 222 narrower than the pitch 252 of the central conductor 221, the total length may be shortened.

Further, as the meander conductors constituting the ribbon-shaped conductor 220, the meander conductor 220b of the first embodiment may be used. Further, there may be employed a configuration that a substance showing a high dielectric constant is disposed in a space between the end conductor 222 and the sheet-shaped conductor 210. In this case, the distance (space) 232 between the end conductor 222 and the sheet-shaped conductor 210 may be made to be substantially the same as the distance (space) 231 between the central conductor 221 and the sheet-shaped conductor 210, like the first embodiment.

Third Embodiment

The third embodiment of the present invention will be explained below. In this embodiment, an antenna is constituted by using a conductor having a cylindrical shape as the sheet-shaped conductor serving as an RF shield, and used as the RF coil 103. The MRI apparatus 100 of this embodiment basically has the same configuration as those of the first and second embodiments. Hereafter, this embodiment will be explained on the basis of the second embodiment with emphasizing the configuration different from that of the second embodiment.

Figure 10:
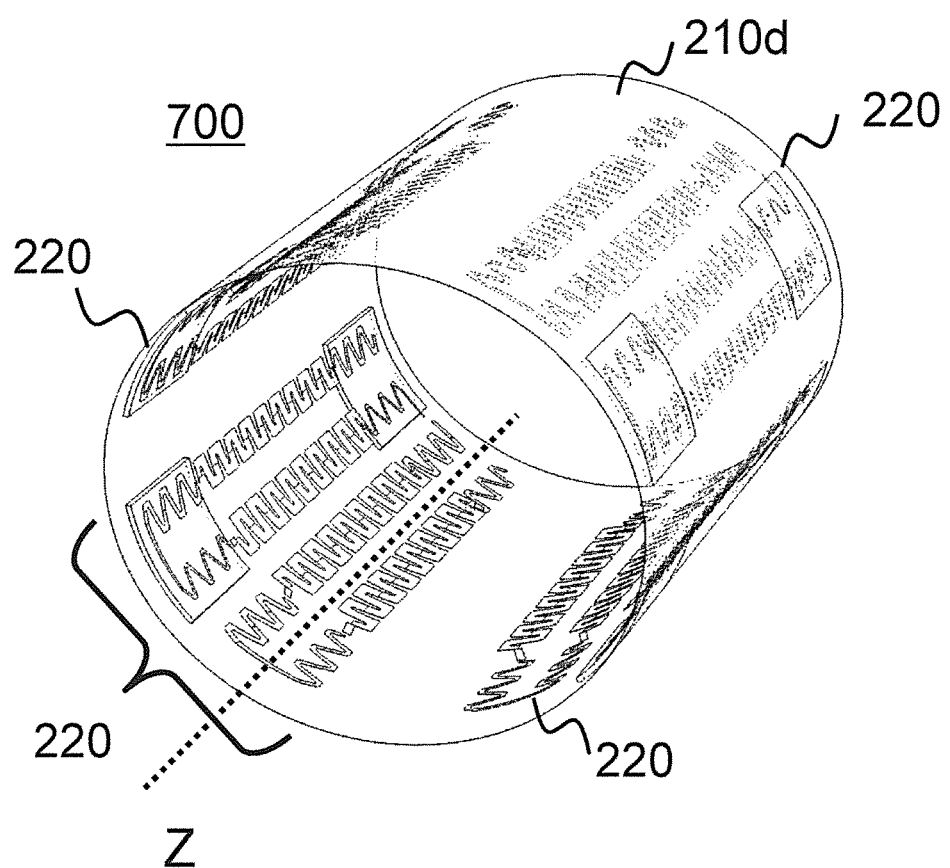
FIG. 10 is an exterior view of the antenna of the third embodiment.

FIG. 10 shows an exterior view of an antenna 700 of this embodiment to be used as the RF coil 103. In the drawing, X, Y, and Z represent axes of the orthogonal coordinate system for explaining the configuration of the antenna 700.

As shown in this drawing, the antenna 700 of this embodiment is provided with a sheet-shaped conductor 210 having a cylindrical shape, and a plurality of the ribbon-shaped conductors 220. In this drawing, an example having four of ribbon-shaped conductors 220 is shown. Each ribbon-shaped conductor 220 has basically the same configuration as that of the ribbon-shaped conductor 220 of the second embodiment. However, it is different from the ribbon-shaped conductor 220 of the second embodiment that each meander conductor is disposed along the internal circumference of the cylindrical sheet-shaped conductor 210d, and the ribbon-shaped conductor 220 is curved as a whole.

Figure 11:
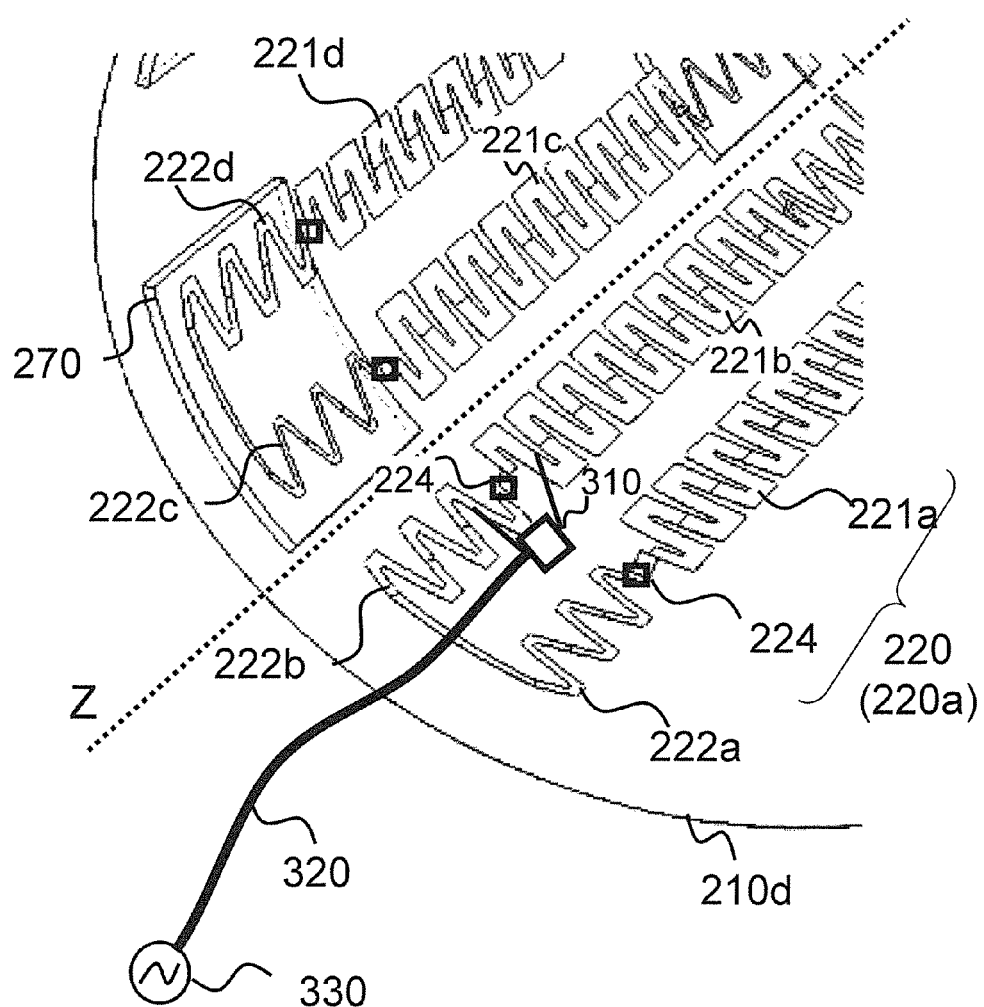
FIG. 11 is an explanatory view for explaining the details of the configuration of the antenna of the third embodiment.

As shown in FIG. 11, the configuration of the ribbon-shaped conductor 220 is basically the same as that of the ribbon-shaped conductor 220 of the second embodiment. As shown in this drawing, each ribbon-shaped conductor 220 is connected to the transmission and/or reception unit 330 via the impedance matching circuit (balun circuit) 310 and the coaxial cable 320, which are connected in parallel with one capacitor 224, to constitute the four-channel antenna 700.

Figure 12:
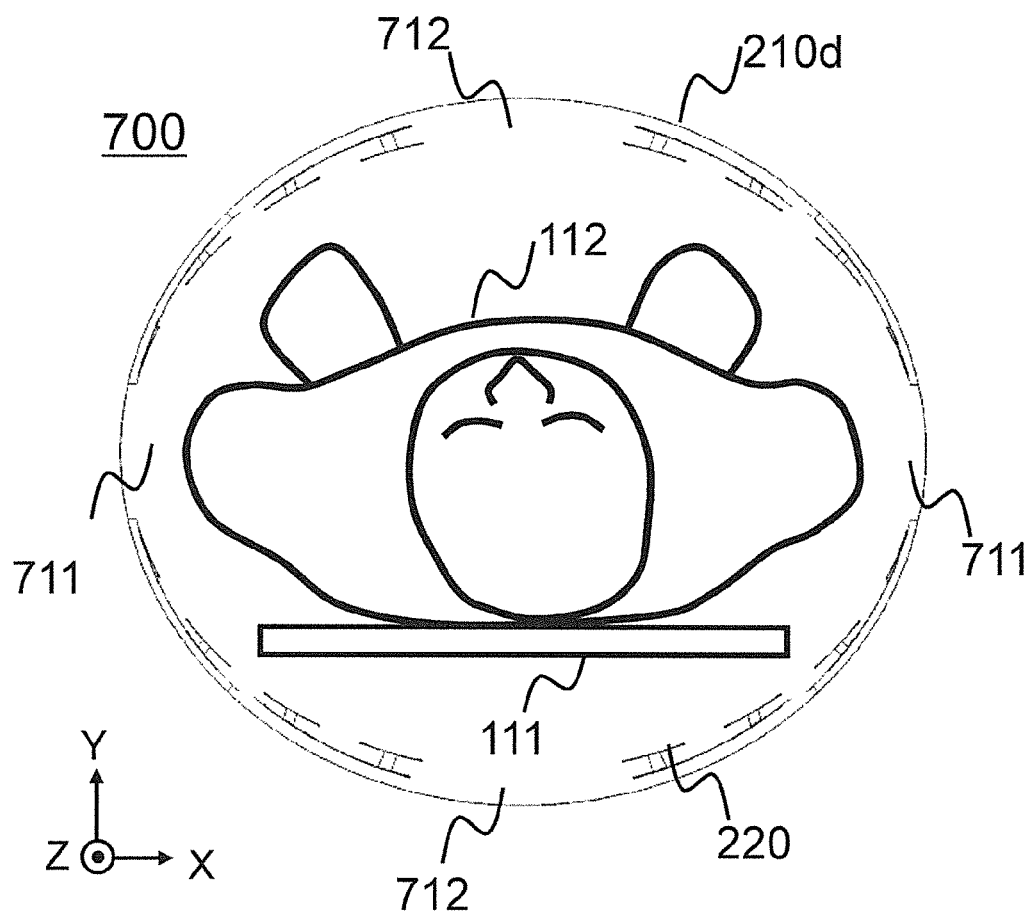
FIG. 12 is an explanatory view for explaining the antenna of the third embodiment in use.

FIG. 12 is a drawing for explaining the state of the antenna 700 of this embodiment mounted on the MRI apparatus 100. In this drawing, the direction that is the center axis direction of elliptic cylinder constituted by the sheet-shaped conductor 210d and is the body axis of the subject 112 laid on the bed 111 is defined as the Z-axis direction. Further, the X-axis direction and Y-axis direction are defined as the directions perpendicular to the Z-axis direction and parallel or perpendicular to the surface of the bed 111, respectively.

The sheet-shaped conductor 210d plays a role of a ground plane (grounding surface), as in the aforementioned embodiments. In the drawing, a sheet-shaped conductor having an elliptic section perpendicular to the Z-axis direction is shown as an example. The shape of the section is not limited to such a shape as mentioned above, and it may be a circular shape, a shape similar to ellipse, or the like.

Each ribbon-shaped conductor 220 is disposed in the inside of the elliptic cylinder constituted by the sheet-shaped conductor 210d with a predetermined distance from the sheet-shaped conductor 210d. In addition, the ribbon-shaped conductor 220 is disposed so that the meandering direction of the meander conductor 220a constituting the ribbon-shaped conductor 220 is the Z-axis direction.

Further, the ribbon-shaped conductors 220 are disposed with a certain distance for the circumferential direction. For example, as shown in this drawing, four of the ribbon-shaped conductors 220 are disposed so that they are in mirror symmetry with respect to two of the perpendicularly intersecting symmetry planes of the ellipse including the center axis of the elliptic cylinder constituted by the sheet-shaped conductor 210d.

FIG. 12 shows an example where four of the ribbon-shaped conductors 220 are disposed in plane symmetry with respect to the plane parallel to the bed 111 and the plane perpendicular to the same. If the X-axis direction and the Y-axis direction are defined as the side-to-side direction and the up-and-down direction, respectively, four of the ribbon-shaped conductors 220 are disposed at upper right, lower right, lower left, and upper left inside the elliptic cylinder constituted by the sheet-shaped conductor 210d, and a uniform MRI image of the subject 112 can be obtained by using them as four channels as a whole.

Further, since these ribbon-shaped conductors 220 are disposed as described above, there are left spaces not having the ribbon-shaped conductor 220 at the right and left parts and upper and lower parts inside the elliptic cylinder constituted by the sheet-shaped conductor 210d (right and left spaces 711, upper and lower spaces 712). When the subject 112 is a human laid on the back thereof, the right and left spaces 711 correspond to the both shoulder parts. Further, the upper space 712 constitutes a space in front of the subject's face. Therefore, according to this embodiment, these spaces can be made larger, and therefore comfort for the human as the subject 112 is increased.

In the antenna 700 of this embodiment, four of the ribbon-shaped conductors 220 are disposed in the inside of the elliptic cylinder as described above, and therefore it has four ports. Coupling between the ports can be suppressed to be −13 dB or lower by using the meandering ribbon-shaped conductor 220 having a meandering shape. The reason for the above is explained with reference to FIGS. 13 and 14. For simplicity of explanation, explanation will be made for the ribbon-shaped conductor 220 constituted by one meander conductor 220a. It is also supposed that the sheet-shaped conductor 210d has a cylindrical shape.

Figures 13A, 13B:
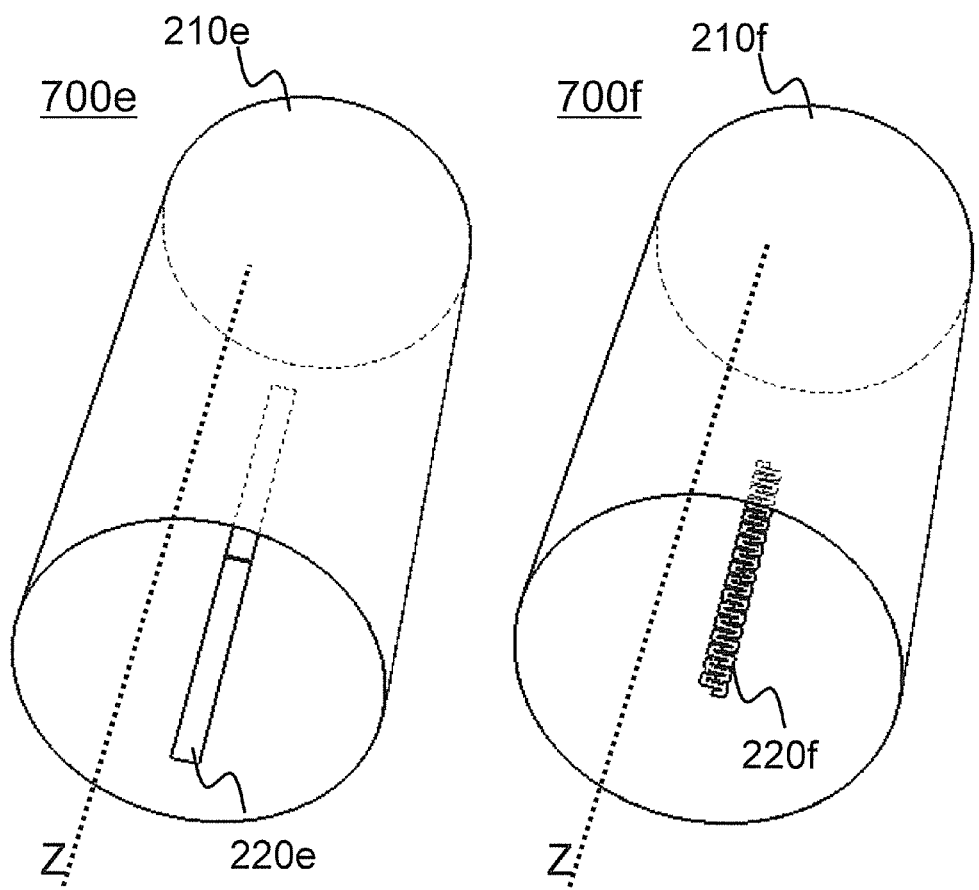
FIG. 13A is an explanatory view for explaining suppression of coupling attained by the antenna of the third embodiment, which is an exterior view of an antenna for comparison having a linear conductor.
FIG. 13B is an explanatory view for explaining suppression of coupling attained by the antenna of the third embodiment, which is an exterior view of the antenna using a meander conductor.

FIG. 13A shows an antenna 700e obliquely seen from above, in which a linear ribbon-shaped conductor 220e having a width of 48 mm (henceforth referred to as linear conductor) is disposed at a lower part of the inside of a sheet-shaped conductor 210e formed in a cylindrical shape having a diameter of 600 mm and a length of 1400 mm (henceforth referred to as cylindrical conductor) with a distance of 20 mm from the cylindrical conductor 210e. FIG. 13B shows an antenna 700f obliquely seen from above, in which a meander conductor 220f having a meandering width of 48 mm, a conductor width of 16 mm and a pitch of 44 mm is disposed at a lower part of the inside of a cylindrical conductor 210f having the same size as that of the cylindrical conductor 210e. In FIG. 13A, and FIG. 13B, the Z-axis direction is defined as the direction parallel to the center axis of the cylindrical conductor 210e or 210f.

A capacitor is disposed at the center of each of the linear conductor 220e and the meander conductor 220f to allow the antenna 700e and the antenna 700f to operate as a half-wave antenna that resonates at about 130 MHz. Intensities of the rotating magnetic fields generated by the cylindrical conductors 210e and 210f at the centers of the cylinders in such an operation as mentioned above were calculated by electromagnetic field simulation. The results are shown in FIG. 14A and FIG. 14B as maps.

Figures 14A, 14B:
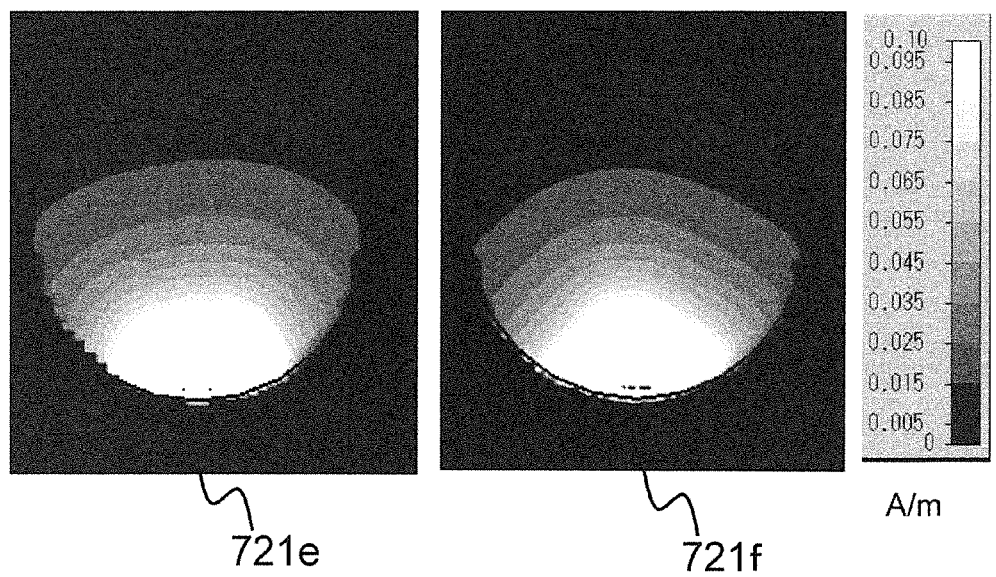
FIG. 14A is an explanatory view for explaining suppression of coupling attained by the antenna of the third embodiment, which shows a rotating magnetic field formed by the antenna for comparison using a linear conductor.
FIG. 14B is an explanatory view for explaining suppression of coupling attained by the antenna of the third embodiment, which shows rotating magnetic field formed by the antenna using a meander conductor.

FIG. 14A shows a map 721e of rotating magnetic field formed by the antenna 700e, and FIG. 14B shows a map 721f of rotating magnetic field formed by the antenna 700f. The rotating magnetic field maps 721e and 721f show magnetic fields generated by inputting electric power of about 1 W into the antennas 700e and 700f, respectively, and the unit of the gray scale is A/m.

On the basis of comparison of the rotating magnetic field maps 721e and 721f, it can be seen that the width for the side-to-side direction of the magnetic field formed by the antenna 700f having the meander conductor 220f is narrower than the width for the side-to-side direction of the magnetic field formed by the antenna 700e having the linear conductor 220e. Therefore, it can be understood that by meandering the ribbon-shaped conductor 220 in a meandering shape, the width of the magnetic field for the side-to-side direction can be made smaller compared with that provided with the linear conductor.

Because of such a property as mentioned above, if a plurality of the meander conductors 220f are aligned to constitute a multi-channel antenna, coupling of adjacent antennas can be reduced compared with a multi-channel antenna constituted by aligning a plurality of linear conductors. That is, in the case of an antenna constituted with multiple channels, coupling with adjacent channel can be reduced by meandering the ribbon-shaped conductor 220.

Example

Hereafter, actual production of the antenna 700 of this embodiment (antenna 700A) and the results of sensitivity and SAR measurement thereof are shown as an example.

The sheet-shaped conductor 210d formed in an elliptic cylindrical shape is defined to have a length of 1000 mm for the Z-axis direction, a major axis and a minor axis of the ellipse as the section perpendicular to the center axis of 594 mm and 520 mm, respectively. The central conductor 221 of each meander conductor 220a constituting the ribbon-shaped conductor 220 is disposed on a surface of an elliptic cylinder having an elliptic section perpendicular to the center axis having a major axis of 584 mm and a minor axis of 470 mm, and having the same axis as that of the ellipse formed by the sheet-shaped conductor 210d. Therefore, in FIG. 11, the distances (spaces) from the central conductors 221a, 221b, 221c, and 221d to the sheet-shaped conductor 210d are different depending on the conductors, and range from about 23 to 8 mm.

In FIG. 11, the meandering widths 251 of four meander conductors 220a shall be about 40 to 50 mm. The pitches of the central conductors 221a, 221b, 221c, and 221d shall be 44 mm, and conductor widths of them shall be 16 mm.

Thus, the central conductors 221a, 221b, 221c, and 221d of four meander conductors 220a are disposed at different distances 231 from the sheet-shaped conductor 210d, and have the same conductor widths 241. Therefore, characteristic impedances of the central conductors 221a 221b, 221c, and 221d of the four meander conductors 220a are different.

Further, the end conductors (222a, 222b, 222c, 222d) of the meander conductors shall have a pitch of 44 mm and a meandering width of 48 mm. However, the conductors have different conductor widths in the range of about 4 to 8 mm. Further, the distance between the end conductor 222a or 222b to the sheet-shaped conductor 210d is 10 mm, and the space between them is filled with air. Further, the distance between the end conductor 222c or 222d and the sheet-shaped conductor 210d is 6 mm, and the space between them is filled with a substance 270 of a high dielectric constant such as Teflon (registered trademark).

With such a configuration as described above, characteristic impedances of the four meander conductors 220a as radio frequency transmission pathways are substantially matched for the portions having large spaces and small spaces 230 with respect to the sheet-shaped conductors 210. That is, the antenna 700 used for the example is designed so as not to show significant change of the characteristic impedance at the connection parts of the both types of portions.

In addition, approximate values of the characteristic impedances are about 80 to 120 ohms, and the characteristic impedance of the meander conductor 220a having a large space 230 on the right side in FIG. 11 is higher. Each of the four meander conductors 220a is designed to have the same impedance in the inside of conductor pathway thereof. However, characteristic impedance may change at the connection point 226 of the adjacent meander conductors 220a. The reason for the above is as follows.

The connection point 226 of the adjacent meander conductors 220a substantially corresponds to the node 513 of current distribution. If transmission cables of different characteristic impedances are connected at the node (electric current is zero) or anti-node (absolute value of electric current is the maximum) of current distribution of standing wave, the resonance frequency of the standing wave does not change. On the other hand, as explained for FIG. 6, if transmission cables of different characteristic impedances are connected at a position other than node or anti-node, the resonance frequency changes. For this reason, it is preferred that impedance is the same and constant in each meander conductor 220a, but impedances of adjacent meander conductors 220a may be different.

The value of the capacitor 224 changes depending on the position, and is a value in the range of about 20 to 200 pF. The values of the capacitors 224 are determined so that four of the meander conductors 220a substantially resonate at the frequency for which the antenna 700 is tuned. In addition, the balun circuit 310 used in this case is constituted by an inductor and a capacitor, and also plays a role for impedance matching. In order to reduce reception noises, a cable balun may be provided in the middle of the coaxial cable 320.

The antenna 700A was actually made as a four-channel antenna on an experimental basis by disposing four of the single-channel ribbon-shaped conductors 220 constituted as shown in FIG. 11 with the aforementioned specification. As a result, an antenna having substantially uniform sensitivity in the inside of the elliptic cylinder shown in FIG. 12 could be constituted. Coupling between the channels of this antenna could be suppressed to be −13 dB or less.

The antenna 700A constituted as described above resonated at about 128 MHz, which is the resonance frequency of three-tesla MRI apparatuses, and intensity of the magnetic field generated at the center when 1 W of input power was supplied to the antenna was about 0.2 microteslas. This value is by no means inferior to the values obtainable with antennas of other type such as birdcage type antennas.

Estimated results of SAR given by the antenna 700A to the subject 112 will be shown below. SAR was calculated by using electromagnetic field simulation for the case of placing a human model in the inside of the antenna 700A. Further, for comparison, a birdcage type antenna having a similar size and sensitivity profile was constituted, and SAR was calculated in the same manner for the case of placing a human model in the inside thereof.

As a result, it was found that the value of SAR given by the antenna 700A was slightly lower than the value of SAR given by the birdcage type antenna.

Further, there was constituted a model (antenna 700B) in which the distance (space) 232 between the end conductor 222 of the meander conductor 220a and the sheet-shaped conductor 210d and the distance (space) 231 between the central conductor 221 and the sheet-shaped conductor 210d were the same, and the other structures were the same as those of the antenna 700A, and SAR given to the human model by the antenna 700B was calculated.

As a result, it was found that the value of SAR given by the antenna 700B increased to about 1.5 times the value of SAR given by the antenna 700A. That is, it was found that SAR could be suppressed to 2/3 (1/1.5) by making the distance (space) 232 between the end conductor 222 and the sheet-shaped conductor 210 narrower than the distance (space) 231 between the central conductor 221 and the sheet-shaped conductor 210d, as in this embodiment.

As described above, in the high magnetic field MRI apparatuses using magnetic fields of three teslas or seven teslas, a higher RF frequency is used, and the wavelength thereof becomes comparable to the size of object of imaging in the inside of the object of imaging. Therefore, unevenness occurs in the obtained images. In order to obviate this problem, RF shimming or parallel transmission, in which two or more channels of irradiation RF antennas are independently controlled, is performed. Since the effect of the RF shimming or parallel transmission is limited in common volume antennas of birdcage type or TEM type having only two independent channels, a volume antenna having three or more channels may be constituted by combining many local antennas, and applied. However, such a configuration increases coupling between the channels, reduces irradiation efficiency, and also reduces uniformity of irradiation.

On the other hand, the antenna 700 of this embodiment is provided with the sheet-shaped conductor 210, M (M is an integer of 1 or larger) of the ribbon-shaped conductor or conductors 220 each having N (N is an integer of 1 or larger) of the meander conductor or conductors of a meandering shape disposed at a predetermined space from the sheet-shaped conductor, the capacitor or capacitors 224 disposed at one or more gaps provided in each meander conductor so as to connect portions of meander conductor divided by the gaps in series, and M of the connection unit each connected to the capacitor or one of the capacitors 224 in parallel in each ribbon-shaped conductor 220, each meander conductor has the central conductor 221 and end conductors 222 disposed on both sides of the central conductor 221, the space 232 between each end conductor 222 and the sheet-shaped conductor 210 is smaller than the space 231 between the central conductor 221 and the sheet-shaped conductor 210, when N is 2 or larger, one end of each meander conductor is connected to one end of adjacent meander conductor so that the meander conductors constitute one string-shaped ribbon-shaped conductor as a whole, and length, meandering width, length of one cycle of meandering of each ribbon-shaped conductor 220, and value of each capacitor 224 are adjusted so that the antenna resonates at frequency of the radio frequency signal.

The sheet-shaped conductor 210 has a cylindrical shape or elliptic cylindrical shape, and each meander conductor of each ribbon-shaped conductor 220 is disposed so that the meandering direction of the meander conductor is substantially parallel to the center axis of the sheet-shaped conductor 210.

Further, the ribbon-shaped conductors 220 may be disposed in the inside of the sheet-shaped conductor 210 with intervals in plane symmetry with respect to two planes perpendicular to each other passing the center axis of the cylinder formed by the sheet-shaped conductor 210.

Therefore, according to this embodiment, even if a multichannel antenna is constituted, coupling between channels can be suppressed compared with conventional local antennas, as described above. Accordingly, according to this embodiment, there can be provided an RF coil that can satisfactorily enjoy the effect of RF shimming with suppressing coupling of a plurality of channels. Thus, not only increase of SAR can be suppressed with maintaining sensitivity, but also images of high quality can be obtained. Further, since the examination space is also expanded for the predetermined directions as shown in FIG. 12, an RF coil for MRI comfortable for subjects can be provided.

In addition, also in this embodiment, various kinds of the modifications explained for the aforementioned embodiments are applicable.

Fourth Embodiment

The fourth embodiment of the present invention will be explained below. The antenna of this embodiment has substantially the same configuration as that of the first or second embodiment. However, it further has a configuration for realizing detuning function.

In the RF coil 103 of the MRI apparatus 100, the transmission function and reception function may be realized with separate antennas as an antenna for transmission and an antenna for reception, respectively. In such a case, there must be required a function for shifting resonation frequency so as to prevent resonation of the antenna at frequency of signals when it does not transmit or receive the signals as an antenna. This function is called detuning function. As the detuning function, the resonance frequency of the antenna for transmission is shifted at the time of reception, and the resonance frequency of the antenna for reception is shifted at the time of transmission.

In order to shift the resonance frequency of the ribbon-shaped conductor 220, the length thereof can be changed. The antennas of the aforementioned embodiments are antennas that resonate at N/2 wavelength, where N is the number of the meander conductors 220a constituting the ribbon-shaped conductor 220. Therefore, if a conductor of a length of about ¼ wavelength is added to the end of N/2 wavelength antenna, the resonance frequency is shifted.

Figure 15:
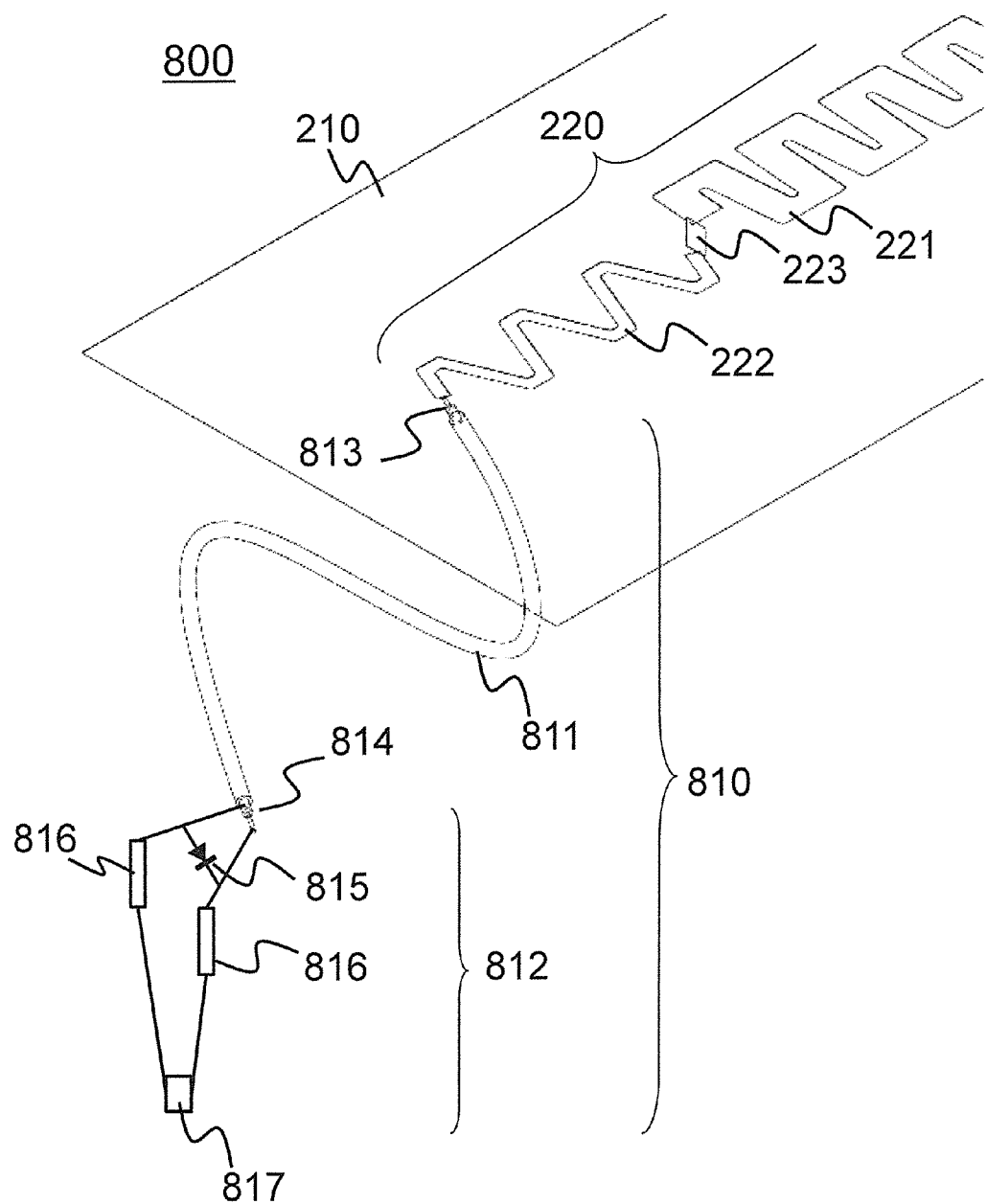
FIG. 15 is an exterior view of the antenna of the fourth embodiment and a detuning circuit.

FIG. 15 is a drawing for explaining an antenna 800 of this embodiment having the detuning function. The antenna of this embodiment is provided with the sheet-shaped conductor 210, the ribbon-shaped conductor 220 and a detuning part 810. In FIG. 15, the sheet-shaped conductor 210 and the ribbon-shaped conductor 220 are only partially shown in order to mainly explain the detuning function.

The ribbon-shaped conductor 220 is provided with the central conductor 221, the end conductors 222, the connection conductors 223, and the capacitor 224 (not shown in this drawing), as in the first embodiment.

The detuning part 810 is provided with a coaxial cable 811 having an electrical length of ¼ wavelength of the wavelength at the frequency for which the antenna 800 is tuned, an electrical connection control part 812, a connection part 813 for the coaxial cable 811 and the ribbon-shaped conductor 220, and a connection part 814 for the coaxial cable 811 and the electrical connection control part 812.

The electrical connection control part 812 is provided between a central conductor and an outer conductor of the coaxial cable 811, and controls electrical connection and insulation between them. The electrical connection control part 812 is provided with a diode 815 connected to the central conductor and the outer conductor in series, two inductors 816 connected to the both ends of the diode 815, respectively, and a direct current power supply 817 connected to the diode via the inductors 816.

The direct current power supply 817 turns on and off the diode 815. The inductors 816 prevent the radio frequency wave for which the ribbon-shaped conductor 220 is tuned from flowing into the direct current power supply 817.

When voltage of the forward direction is applied to the diode 815, thus electric current flows in it, and the ON state is attained, the connection part 814 at the end part of the coaxial cable 811 on the side of the diode 815 is in the short circuit state. In this state, since the coaxial cable 811 has an electrical length of ¼ wavelength, the connection part 813 with the ribbon-shaped conductor 220 has high impedance. Therefore, the connection part 813 at the end part of the ribbon-shaped conductor 220 corresponds to a node of electric current, and operation of the antenna 800 does not change from the usual one. Therefore, when the diode 815 is in the ON state, the antenna 800 functions as a usual antenna.

On the contrary, when the voltage applied to the diode 815 is 0 or applied in the opposite direction, electric current does not flow in the diode 815, and the connection part 814 at the end part of the coaxial cable 811 on the side of the diode 815 is in an open state. In this state, the connection part 813 of the ribbon-shaped conductor 220 with the coaxial cable 811 has low impedance, and a state that electric current sufficiently flows is realized. Thus, the electrical length of the whole ribbon-shaped conductor 220 becomes longer by ¼ wavelength, and the antenna 800 no longer resonates at resonance frequency at which it originally resonates. That is, a detuned state is attained.

As described above, by operating the direct current power supply 817 so that the diode is made to be in the ON state at the time of transmission, and in the OFF state in the other cases, the antenna 800 of this embodiment can be used as an antenna for transmission. Further, by operating the direct current power supply 817 so that the diode is made to be in the ON state at the time of reception, and in the OFF state in the other cases, the antenna 800 of this embodiment can be used as an antenna for reception. Furthermore, if the direct current power supply 817 is operated so that the diode is always in the ON state, it can be used as an antenna for transmission and reception.

As explained above, the antenna 800 of this embodiment is provided with the sheet-shaped conductor 210, M (M is an integer of 1 or larger) of the ribbon-shaped conductor or conductors 220 each having N (N is an integer of 1 or larger) of the meander conductor or conductors of a meandering shape disposed at a predetermined space from the sheet-shaped conductor 210, the capacitor or capacitors 224 disposed at one or more gaps provided in each meander conductor so as to connect portions of meander conductor divided by the gaps in series, and M of the connection unit each connected to the capacitor or one of the capacitors 224 in parallel in each ribbon-shaped conductor 220, each meander conductor has the central conductor 221 and end conductors 222 disposed on both sides of the central conductor 221, the space 232 between each end conductor 222 and the sheet-shaped conductor 210 is smaller than the space 231 between the central conductor and the sheet-shaped conductor, when N is 2 or larger, one end of each meander conductor is connected to one end of adjacent meander conductor so that the meander conductors constitute one string-shaped ribbon-shaped conductor 220 as a whole, and length, meandering width, length of one cycle of meandering of each ribbon-shaped conductor 220, and value of each capacitor 224 are adjusted so that the antenna resonates at frequency of the radio frequency signal.

It is further provided with the detuning part 810 as a detuning unit connected to one end of the ribbon-shaped conductor 220, and the detuning unit 810 is provided with the coaxial cable 811 having an electrical length of ¼ wavelength of the wavelength of the radio frequency signal, and the electrical connection control part 812 connected to the central conductor and the outer conductor in series, which is an electrical connection control unit for controlling electrical connection and insulation between the central conductor and the outer conductor.

The electrical connection control unit may have the diode 815 connected to the central conductor and the outer conductor of the coaxial cable 811 in series, the inductors 816 connected to the both ends of the diode 815, respectively, and the direct current power supply 817 connected to the diode via the inductors 816.

That is, according to this embodiment, in addition to the effect of the first embodiment, the antenna can be used not only as an antenna for transmission and reception, but also as an antenna for only transmission or only reception, as an antenna used for MRI, and thus usefulness is enhanced.

In the above explanation of this embodiment, an example in which the antenna 200 of the first embodiment is used as the basic configuration, and the detuning part 810 is added to it was mentioned and explained as the antenna 800. However, the antenna used as the basic configuration may be any of the modifications thereof 200a, 200b, 200c, the antenna 600 of the second embodiment, and the antenna 700 of the third embodiment.

In addition, the antennas of the aforementioned embodiments can be used for not only the RF coil 103 of MRI apparatuses, but also any apparatuses using electromagnetic waves of a frequency of several MHz to several GHz.

DENOTATION OF REFERENCE NUMERALS

100: MRI apparatus, 101: magnet, 102: gradient coil, 103: RF coil, 104: transceiver, 105: data processing part, 106: transmission and reception cable, 107: gradient magnetic field control cable, 108: display, 109: gradient magnetic field power supply, 111: bed, 112: subject, 112a: subject position, 200: antenna, 200b: antenna, 200c: antenna, 210: sheet-shaped conductor, 210d: sheet-shaped conductor, 210e: cylindrical conductor, 210f: cylindrical conductor, 220: ribbon-shaped conductor, 220a: meander conductor, 220b: meander conductor, 220e: linear conductor, 220f: meander conductor, 221: central conductor, 221a: central conductor, 222: end conductor, 222a: end conductor, 222b: end conductor, 222c: end conductor, 222d: end conductor, 223: connection conductor, 224: capacitor, 225: end part, 226: connection point, 230: space, 231: space, 232: space, 240: conductor width, 241: conductor width, 242: conductor width, 251: meandering width, 252: pitch, 260: shield, 270: high dielectric constant substance, 290: postulated meander conductor, 310: impedance matching circuit, 320: coaxial cable, 330: transmission and/or reception part, 410: magnetic flux, 511: arrow indicating electric current, 512: arrow indicating electric current, 513: node, 521: electric current graph, 522: electric current graph, 531: voltage graph, 532: voltage graph, 541: absolute value of electric field, 542: absolute value of electric field, 551: absolute value of rotating magnetic field, 552: absolute value of rotating magnetic field, 600: antenna, 700: antenna, 700A: antenna, 700B: antenna, 700e: antenna, 700f: antenna, 711: right and left spaces, 712: upper and lower spaces, 721e: rotating magnetic field map, 721f: rotating magnetic field map, 800: antenna, 810: detuning part, 811: coaxial cable, 812: electrical connection control part, 813: connection part, 814: connection part, 815: diode, 816: inductor, 817: direct current power supply

The invention claimed is:

1. An antenna device used for at least one of transmission and reception of a radio frequency signal, comprising:
   a sheet-shaped conductor;
   an M number of ribbon-shaped conductors, each comprising an N number of meander conductors disposed with a predetermined space from the sheet-shaped conductor and having a meandering shape, wherein both M and N are integers having values of 1 or larger;
   one or more capacitors disposed at one or more gaps provided in each meander conductor so as to connect portions of each meander conductor divided by the gaps in series; and
   an M number of connection units each connected to the one or more capacitors in parallel in each ribbon-shaped conductor,
   wherein each meander conductor comprises:
     a central conductor; and
     end conductors disposed on both sides of the central conductor,
   wherein a space between each end conductor and the sheet-shaped conductor is smaller than a space between the central conductor and the sheet-shaped conductor, and
   wherein length, meandering width, length of one cycle of meandering of each ribbon-shaped conductor, and value of each capacitor are adjusted so that the antenna device resonates at frequency of the radio frequency signal.

2. The antenna device according to claim 1, wherein:
   length of each of the ribbon-shaped conducts and value of each of the one or more capacitors are adjusted so that number of node of current distribution generated in the ribbon-shaped conductor at the time of resonance is N−1, and the node is generated in the end conductor.

3. The antenna device according to claim 1, wherein conductor width of the end conductor connected to the central conductor is smaller than conductor width of the central conductor.

4. The antenna device according to claim 1, further comprising a substance having a dielectric constant higher than that of air between the end conductor and the sheet-shaped conductor.

5. The antenna device according to claim 1, further comprising a connection capacitor connecting the central conductor and the end conductor in series, and wherein the connection unit is connected to the connection capacitor in parallel.

6. The antenna device according to claim 1, wherein the space between each meander conductor and the sheet-shaped conductor smoothly and continuously changes so that it becomes smaller towards an end part.

7. The antenna device according to claim 1, further comprising a shield electrically connected to the sheet-shaped conductor, and covering the end conductor.

8. The antenna device according to claim 1, wherein the sheet-shaped conductor has a cylindrical shape or an elliptic cylindrical shape, and
   at least one the N number of meander conductors of at least one of the M number of ribbon-shaped conductors is disposed so that meandering direction of the at least one meander conductor is substantially parallel to the center axis of the sheet-shaped conductor.

9. The antenna device according to claim 8, wherein:
   the ribbon-shaped conductors are disposed in the inside of the sheet-shaped conductor with intervals in plane symmetry with respect to two planes passing the center axis of the cylinder formed by the sheet-shaped conductor and perpendicular to each other.

10. The antenna device according to claim 1, wherein:
    electrical length of each meander conductor is a half of the wavelength of the radio frequency signal.

11. The antenna device according to claim 1, further comprising a detuning unit connected to one end of each ribbon-shaped conductor, and wherein the detuning unit comprises:
- a coaxial cable having an electrical length of ¼ wavelength of the radio frequency signal; and
- an electrical connection control part that is connected to a central conductor and an outer conductor of the coaxial cable in series, and controls electrical connection and insulation of the central conductor and the outer conductor.

12. The antenna device according to claim 11, wherein the electrical connection control part comprises:
- a diode connected to the central conductor and the outer conductor in series;
- inductors connected to both ends of the diode; and
- a direct current power supply connected to the diode via the inductors.

13. A magnetic resonance imaging apparatus comprising:
- a static magnetic field generating unit which generates a static magnetic field;
- an RF coil which is disposed in the static magnetic field generated by the static magnetic field generating unit irradiates a radio frequency signal in a direction perpendicular to the direction of the static magnetic field, and detects a radio frequency signal in the direction perpendicular to the direction of the static magnetic field; and
- an imaging unit for imaging internal information of a subject stayed in the static magnetic field using nuclear magnetic resonance signals generated from the subject and detected by the RF coil, wherein the apparatus comprises the antenna device according to claim 1 as the RF coil.

14. A magnetic resonance imaging apparatus comprising:
- a static magnetic field generating unit which generates a static magnetic field;
- a transmission RF coil which is disposed in the static magnetic field generated by the static magnetic field generating unit, and irradiates a radio frequency signal in a direction perpendicular to the direction of the static magnetic field;
- a reception RF coil which detects a radio frequency signal in a direction perpendicular to the direction of the static magnetic field; and
- an imaging unit for imaging internal information of a subject stayed in the static magnetic field using nuclear magnetic resonance signals generated from the subject and detected by the reception RF coil, wherein the apparatus comprises the antenna device according to claim 1 as at least one of the transmission RF coil and the reception RF coil.

15. The antenna conductor according to claim 1, wherein when the N number of meander conductors is 2 or larger, one end of each meander conductor is connected to one end of an adjacent meander conductor so that both meander conductors constitute one string-shaped ribbon-shaped conductor as a whole.

* * * * *